US010131279B2

(12) United States Patent
Minikey, Jr. et al.

(10) Patent No.: US 10,131,279 B2
(45) Date of Patent: Nov. 20, 2018

(54) DISPLAY MIRROR ASSEMBLY WITH AN RF SHIELD BEZEL

(71) Applicant: Gentex Corporation, Zeeland, MI (US)

(72) Inventors: Danny L. Minikey, Jr., Fenwick, MI (US); Richard T. Fish, Jr., Hudsonville, MI (US); Richard Allen Berry, Zeeland, MI (US); Jason D. Hallack, Allendale, MI (US)

(73) Assignee: GENTEX CORPORATION, Zeeland, MI (US)

( * ) Notice: Subject to any disclaimer, the term of this patent is extended or adjusted under 35 U.S.C. 154(b) by 149 days.

(21) Appl. No.: 14/958,236

(22) Filed: Dec. 3, 2015

(65) Prior Publication Data

US 2016/0159287 A1 Jun. 9, 2016

Related U.S. Application Data

(60) Provisional application No. 62/086,841, filed on Dec. 3, 2014.

(51) Int. Cl.
*G01J 1/44* (2006.01)
*B60R 1/12* (2006.01)
(Continued)

(52) U.S. Cl.
CPC .................. *B60R 1/12* (2013.01); *B60R 1/04* (2013.01); *B60R 1/086* (2013.01); *B60R 1/088* (2013.01);
(Continued)

(58) Field of Classification Search
CPC ........... B60R 1/04; B60R 1/086; B60R 1/088; B60R 1/12; B60R 2001/1215; B60R 2001/1253; H04N 5/225; H05K 9/0054
See application file for complete search history.

(56) References Cited

U.S. PATENT DOCUMENTS 2,131,888 A 10/1938 Harris
2,632,040 A 3/1953 Rabinow
(Continued)

FOREIGN PATENT DOCUMENTS

DE 102010064082 A1 6/2012
EP 0513476 11/1992
(Continued)

OTHER PUBLICATIONS

Federal Institute of Industrial Property, "International Search Report and Written Opinion," International Application No. PCT/US2015/063709, dated Dec. 8, 2016 (9 pages).
(Continued)

*Primary Examiner* — Thanh Luu
(74) *Attorney, Agent, or Firm* — Price Heneveld LLP; Bradley D. Johnson

(57) ABSTRACT

A display mirror assembly for a vehicle includes a housing and a glass element, and is configured to be turned to an on state and an off state. A peripheral support is disposed proximate a periphery of the glass element and configured to retain the glass element against the display module. The peripheral support includes a radio frequency shield integral therewith. An actuator device is disposed on a bottom surface of the housing and operably coupled with the glass element. The actuator device is adjustable to tilt the glass element in one direction, thereby moving the glass element to an off-axis position which approximately simultaneously changes the on/off state of the display module. The actuator device is adjustable to tilt the glass element in another direction, thereby moving the glass element to an on-axis position which approximately simultaneously changes the on/off state of the display module.

19 Claims, 11 Drawing Sheets

(51) Int. Cl.
*B60R 1/04* (2006.01)
*B60R 1/08* (2006.01)
*H04N 5/225* (2006.01)
*H05K 9/00* (2006.01)

(52) U.S. Cl.
CPC ........... *H04N 5/225* (2013.01); *H05K 9/0045* (2013.01); *H05K 9/0054* (2013.01); *B60R 2001/1215* (2013.01)

(56) References Cited

U.S. PATENT DOCUMENTS

| | | |
|---|---|---|
| 2,827,594 A | 3/1958 | Rabinow |
| 3,179,845 A | 4/1965 | Kulwiec |
| 3,280,701 A | 10/1966 | Donnelly et al. |
| 3,581,276 A | 5/1971 | Newman |
| 3,663,819 A | 5/1972 | Hicks et al. |
| 3,837,129 A | 9/1974 | Losell |
| 4,109,235 A | 8/1978 | Bouthors |
| 4,139,801 A | 2/1979 | Linares |
| 4,151,526 A | 4/1979 | Hinachi et al. |
| 4,214,266 A | 7/1980 | Myers |
| 4,236,099 A | 11/1980 | Rosenblum |
| 4,257,703 A | 3/1981 | Goodrich |
| 4,258,979 A | 3/1981 | Mahin |
| 4,277,804 A | 7/1981 | Robison |
| 4,286,308 A | 8/1981 | Wolff |
| 4,310,851 A | 1/1982 | Pierrat |
| 4,357,558 A | 11/1982 | Massoni et al. |
| 4,376,909 A | 3/1983 | Tagami et al. |
| 4,479,173 A | 10/1984 | Rumpakis |
| 4,499,451 A | 2/1985 | Suzuki et al. |
| D283,998 S | 5/1986 | Tanaka |
| 4,599,544 A | 7/1986 | Martin |
| 4,630,904 A | 12/1986 | Pastore |
| 4,638,287 A | 1/1987 | Umebayashi et al. |
| 4,645,975 A | 2/1987 | Meitzler et al. |
| 4,665,321 A | 5/1987 | Chang et al. |
| 4,665,430 A | 5/1987 | Hiroyasu |
| 4,692,798 A | 9/1987 | Seko et al. |
| 4,716,298 A | 12/1987 | Etoh |
| 4,727,290 A | 2/1988 | Smith et al. |
| 4,740,838 A | 4/1988 | Mase et al. |
| 4,768,135 A | 8/1988 | Kretschmer et al. |
| 4,862,037 A | 8/1989 | Farber et al. |
| 4,891,559 A | 1/1990 | Matsumoto et al. |
| 4,902,108 A | 2/1990 | Byker |
| 4,910,591 A | 3/1990 | Petrossian et al. |
| 4,930,742 A | 6/1990 | Schofield et al. |
| 4,934,273 A | 6/1990 | Endriz |
| 4,967,319 A | 10/1990 | Seko |
| 5,005,213 A | 4/1991 | Hanson et al. |
| 5,008,946 A | 4/1991 | Ando |
| 5,027,200 A | 6/1991 | Petrossian et al. |
| 5,036,437 A | 7/1991 | Macks |
| 5,052,163 A | 10/1991 | Czekala |
| 5,066,112 A | 11/1991 | Lynam et al. |
| 5,069,535 A | 12/1991 | Baucke et al. |
| 5,072,154 A | 12/1991 | Chen |
| 5,073,012 A | 12/1991 | Lynam |
| 5,076,673 A | 12/1991 | Lynam et al. |
| 5,086,253 A | 2/1992 | Lawler |
| 5,096,287 A | 3/1992 | Kakinami et al. |
| 5,115,346 A | 5/1992 | Lynam |
| 5,121,200 A | 6/1992 | Choi et al. |
| 5,124,549 A | 6/1992 | Michaels et al. |
| 5,128,799 A | 7/1992 | Byker |
| 5,151,824 A | 9/1992 | O'Farrell |
| 5,158,638 A | 10/1992 | Osanami et al. |
| 5,166,681 A | 11/1992 | Bottesch et al. |
| 5,182,502 A | 1/1993 | Slotkowski et al. |
| 5,187,383 A | 2/1993 | Taccetta et al. |
| 5,197,562 A | 3/1993 | Kakinami et al. |
| 5,230,400 A | 7/1993 | Kakainami et al. |
| 5,235,178 A | 8/1993 | Hegyi |
| 5,243,417 A | 9/1993 | Pollard |
| 5,253,109 A | 10/1993 | O'Farrell et al. |
| 5,278,693 A | 1/1994 | Theiste |
| 5,280,380 A | 1/1994 | Byker |
| 5,282,077 A | 1/1994 | Byker |
| 5,289,321 A | 2/1994 | Secor |
| 5,294,376 A | 3/1994 | Byker |
| 5,296,924 A | 3/1994 | Blancard et al. |
| D346,356 S | 4/1994 | Leu |
| 5,304,980 A | 4/1994 | Maekawa |
| 5,329,206 A | 7/1994 | Slotkowski et al. |
| 5,336,448 A | 8/1994 | Byker |
| 5,347,261 A | 9/1994 | Adell |
| 5,347,459 A | 9/1994 | Greenspan et al. |
| 5,355,146 A | 10/1994 | Chiu et al. |
| 5,379,104 A | 1/1995 | Takao |
| 5,379,146 A | 1/1995 | Defendini |
| 5,381,309 A | 1/1995 | Borchardt |
| 5,386,285 A | 1/1995 | Asayama |
| 5,396,054 A | 3/1995 | Krichever et al. |
| 5,402,170 A | 3/1995 | Parulski et al. |
| 5,408,357 A | 4/1995 | Beukema |
| 5,414,461 A | 5/1995 | Kishi et al. |
| 5,416,318 A | 5/1995 | Hegyi |
| 5,418,610 A | 5/1995 | Fischer |
| 5,421,940 A | 6/1995 | Cornils et al. |
| 5,424,952 A | 6/1995 | Asayama |
| 5,426,294 A | 6/1995 | Kobayashi et al. |
| 5,428,464 A | 6/1995 | Silverbrook |
| 5,430,450 A | 7/1995 | Holmes |
| 5,434,407 A | 7/1995 | Bauer et al. |
| 5,448,397 A | 9/1995 | Tonar |
| 5,451,822 A | 9/1995 | Bechtel et al. |
| 5,452,004 A | 9/1995 | Roberts |
| 5,469,298 A | 11/1995 | Suman et al. |
| 5,471,515 A | 11/1995 | Fossum et al. |
| 5,475,441 A | 12/1995 | Parulski et al. |
| 5,475,494 A | 12/1995 | Nishida et al. |
| 5,481,268 A | 1/1996 | Higgins |
| 5,483,346 A | 1/1996 | Butzer |
| 5,483,453 A | 1/1996 | Uemura et al. |
| 5,485,155 A | 1/1996 | Hibino |
| 5,485,378 A | 1/1996 | Franke et al. |
| 5,488,496 A | 1/1996 | Pine |
| 5,508,592 A | 4/1996 | Lapatovich et al. |
| 5,515,448 A | 5/1996 | Nishitani |
| 5,523,811 A | 6/1996 | Wada et al. |
| 5,530,421 A | 6/1996 | Marshall et al. |
| 5,535,144 A | 7/1996 | Kise |
| 5,537,003 A | 7/1996 | Bechtel et al. |
| 5,541,590 A | 7/1996 | Nishio |
| 5,541,724 A | 7/1996 | Hoashi |
| 5,550,677 A | 8/1996 | Schofield et al. |
| 5,554,912 A | 9/1996 | Thayer et al. |
| 5,574,443 A | 11/1996 | Hsieh |
| 5,574,463 A | 11/1996 | Shirai et al. |
| 5,576,975 A | 11/1996 | Sasaki et al. |
| 5,587,929 A | 12/1996 | League et al. |
| 5,592,146 A | 1/1997 | Kover, Jr. et al. |
| 5,602,542 A | 2/1997 | Windmann et al. |
| 5,614,788 A | 3/1997 | Mullins et al. |
| 5,615,023 A | 3/1997 | Yang |
| 5,617,085 A | 4/1997 | Tsutsumi et al. |
| 5,621,460 A | 4/1997 | Hatlestad et al. |
| 5,634,709 A | 6/1997 | Iwama |
| 5,642,238 A | 6/1997 | Sala |
| 5,646,614 A | 7/1997 | Abersfelder et al. |
| 5,649,756 A | 7/1997 | Adams et al. |
| 5,650,765 A | 7/1997 | Park |
| 5,660,454 A | 8/1997 | Mori et al. |
| 5,666,028 A | 9/1997 | Bechtel et al. |
| 5,670,935 A | 9/1997 | Schofield et al. |
| 5,679,283 A | 10/1997 | Tonar |
| 5,680,123 A | 10/1997 | Lee |
| 5,682,267 A | 10/1997 | Tonar |
| 5,684,473 A | 11/1997 | Hibino et al. |
| 5,689,370 A | 11/1997 | Tonar |
| 5,707,129 A | 1/1998 | Kobayashi |
| 5,708,410 A | 1/1998 | Blank et al. |

(56) References Cited

U.S. PATENT DOCUMENTS

| | | |
|---|---|---|
| 5,708,857 A | 1/1998 | Ishibashi |
| 5,710,565 A | 1/1998 | Shirai et al. |
| 5,714,751 A | 2/1998 | Chen |
| 5,715,093 A | 2/1998 | Schierbeek et al. |
| 5,729,194 A | 3/1998 | Spears et al. |
| 5,736,816 A | 4/1998 | Strenke et al. |
| 5,742,026 A | 4/1998 | Dickinson |
| 5,745,050 A | 4/1998 | Nakagawa |
| 5,751,211 A | 5/1998 | Shirai et al. |
| 5,751,832 A | 5/1998 | Panter et al. |
| 5,754,099 A | 5/1998 | Nishimura et al. |
| 5,760,828 A | 6/1998 | Cortes |
| 5,764,139 A | 6/1998 | Nojima et al. |
| 5,767,793 A | 6/1998 | Agravante et al. |
| 5,781,105 A | 7/1998 | Bitar et al. |
| 5,786,787 A | 7/1998 | Eriksson et al. |
| 5,790,298 A | 8/1998 | Tonar |
| 5,793,308 A | 8/1998 | Rosinski et al. |
| 5,793,420 A | 8/1998 | Schmidt |
| 5,796,094 A | 8/1998 | Schofield et al. |
| 5,798,727 A | 8/1998 | Shirai et al. |
| 5,803,579 A | 9/1998 | Turnbull |
| 5,808,778 A | 9/1998 | Bauer et al. |
| 5,811,888 A | 9/1998 | Hsieh |
| 5,812,321 A | 9/1998 | Schierbeek et al. |
| 5,818,625 A | 10/1998 | Forgette et al. |
| 5,825,527 A | 10/1998 | Forgette et al. |
| D400,481 S | 11/1998 | Stephens et al. |
| D401,200 S | 11/1998 | Huang |
| 5,837,994 A | 11/1998 | Stam |
| 5,841,126 A | 11/1998 | Fossum et al. |
| 5,844,505 A | 12/1998 | Van Ryzin |
| 5,845,000 A | 12/1998 | Breed et al. |
| 5,850,176 A | 12/1998 | Kinoshita et al. |
| 5,867,214 A | 2/1999 | Anderson et al. |
| 5,877,897 A | 3/1999 | Schofield et al. |
| 5,883,739 A | 3/1999 | Ashihara et al. |
| 5,888,431 A | 3/1999 | Tonar et al. |
| 5,896,119 A | 4/1999 | Evanicky et al. |
| 5,904,729 A | 5/1999 | Ruzicka |
| 5,905,457 A | 5/1999 | Rashid |
| D410,607 S | 6/1999 | Carter |
| 5,912,534 A | 6/1999 | Benedict |
| 5,923,027 A | 7/1999 | Stam |
| 5,923,457 A | 7/1999 | Byker et al. |
| 5,928,572 A | 7/1999 | Tonar et al. |
| 5,935,613 A | 8/1999 | Benham et al. |
| 5,940,011 A | 8/1999 | Agravante et al. |
| 5,940,201 A | 8/1999 | Ash et al. |
| 5,942,853 A | 8/1999 | Piscart |
| 5,949,331 A | 9/1999 | Schofield et al. |
| 5,956,012 A | 9/1999 | Turnbull et al. |
| 5,956,079 A | 9/1999 | Ridgley |
| 5,956,181 A | 9/1999 | Lin |
| 5,959,555 A | 9/1999 | Furuta |
| 5,990,469 A | 11/1999 | Bechtel |
| 5,998,617 A | 12/1999 | Srinivasa |
| 6,002,511 A | 12/1999 | Varaprasad |
| 6,008,486 A | 12/1999 | Stam |
| 6,009,359 A | 12/1999 | El-Hakim et al. |
| 6,018,308 A | 1/2000 | Shirai |
| 6,020,987 A | 2/2000 | Baumann |
| 6,023,040 A | 2/2000 | Zahavi |
| 6,023,229 A | 2/2000 | Bugno et al. |
| 6,025,872 A | 2/2000 | Ozaki et al. |
| 6,037,471 A | 3/2000 | Srinivasa |
| 6,043,452 A | 3/2000 | Bestenlehrer |
| 6,046,766 A | 4/2000 | Sakata |
| 6,049,171 A | 4/2000 | Stam |
| 6,051,956 A | 4/2000 | Nakashimo |
| 6,060,989 A | 5/2000 | Gehlot |
| 6,061,002 A | 5/2000 | Weber et al. |
| 6,062,920 A | 5/2000 | Jordan |
| 6,064,508 A | 5/2000 | Forgette et al. |
| 6,064,509 A | 5/2000 | Tonar et al. |
| 6,067,111 A | 5/2000 | Hahn et al. |
| 6,068,380 A | 5/2000 | Lynn et al. |
| 6,072,391 A | 6/2000 | Suzuki et al. |
| 6,078,355 A | 6/2000 | Zengel |
| 6,084,700 A | 7/2000 | Knapp |
| 6,097,023 A | 8/2000 | Schofield et al. |
| 6,102,546 A | 8/2000 | Carter |
| 6,106,121 A | 8/2000 | Buckley et al. |
| 6,111,498 A | 8/2000 | Jobes et al. |
| 6,111,683 A | 8/2000 | Cammenga |
| 6,111,684 A | 8/2000 | Forgette |
| 6,115,651 A | 9/2000 | Cruz |
| 6,122,597 A | 9/2000 | Saneyoshi et al. |
| 6,128,576 A | 10/2000 | Nishimoto et al. |
| 6,130,421 A | 10/2000 | Bechtel |
| 6,130,448 A | 10/2000 | Bauer et al. |
| 6,132,072 A | 10/2000 | Turnbull |
| 6,140,933 A | 10/2000 | Bugno |
| 6,144,158 A | 11/2000 | Beam |
| 6,151,065 A | 11/2000 | Steed et al. |
| 6,151,539 A | 11/2000 | Bergholz et al. |
| 6,154,149 A | 11/2000 | Tychkowski et al. |
| 6,157,294 A | 12/2000 | Urai et al. |
| 6,166,629 A | 12/2000 | Andreas |
| 6,166,698 A | 12/2000 | Turnbull et al. |
| 6,166,848 A | 12/2000 | Cammenga et al. |
| 6,167,755 B1 | 1/2001 | Damson et al. |
| 6,170,956 B1 | 1/2001 | Rumsey et al. |
| 6,172,600 B1 | 1/2001 | Kakinami et al. |
| 6,172,601 B1 | 1/2001 | Wada et al. |
| 6,175,300 B1 | 1/2001 | Kendrick |
| 6,184,781 B1 | 2/2001 | Ramakesavan |
| 6,185,492 B1 | 2/2001 | Kagawa et al. |
| 6,188,505 B1 | 2/2001 | Lomprey |
| 6,191,704 B1 | 2/2001 | Takenaga et al. |
| 6,193,378 B1 | 2/2001 | Tonar et al. |
| 6,193,912 B1 | 2/2001 | Theiste |
| 6,195,194 B1 | 2/2001 | Roberts et al. |
| 6,200,010 B1 | 3/2001 | Anders |
| 6,218,934 B1 | 4/2001 | Regan |
| 6,222,177 B1 | 4/2001 | Bechtel |
| 6,222,447 B1 | 4/2001 | Schofield et al. |
| 6,224,716 B1 | 5/2001 | Yoder |
| 6,229,435 B1 | 5/2001 | Knapp |
| 6,239,898 B1 | 5/2001 | Byker |
| 6,239,899 B1 | 5/2001 | Devries et al. |
| 6,244,716 B1 | 6/2001 | Steenwyk |
| 6,246,507 B1 | 6/2001 | Bauer |
| 6,247,819 B1 | 6/2001 | Turnbull |
| 6,249,214 B1 | 6/2001 | Kashiwazaki |
| 6,249,369 B1 | 6/2001 | Theiste et al. |
| 6,250,766 B1 | 6/2001 | Strumolo et al. |
| 6,255,639 B1 | 7/2001 | Stam |
| 6,259,475 B1 | 7/2001 | Ramachandran et al. |
| 6,262,831 B1 | 7/2001 | Bauer |
| 6,262,832 B1 | 7/2001 | Lomprey |
| 6,265,968 B1 | 7/2001 | Betzitza et al. |
| 6,268,803 B1 | 7/2001 | Gunderson et al. |
| 6,268,950 B1 | 7/2001 | Ash |
| 6,269,308 B1 | 7/2001 | Kodaka et al. |
| 6,281,632 B1 | 8/2001 | Stam |
| 6,281,804 B1 | 8/2001 | Haller et al. |
| 6,289,332 B2 | 9/2001 | Menig et al. |
| 6,291,812 B1 | 9/2001 | Bechtel |
| 6,300,879 B1 | 10/2001 | Regan et al. |
| 6,304,173 B2 | 10/2001 | Pala et al. |
| 6,313,457 B1 | 11/2001 | Bauer |
| 6,313,892 B2 | 11/2001 | Gleckman |
| 6,317,057 B1 | 11/2001 | Lee |
| 6,317,248 B1 | 11/2001 | Agrawal et al. |
| 6,320,612 B1 | 11/2001 | Young |
| 6,324,295 B1 | 11/2001 | Avionique et al. |
| D451,869 S | 12/2001 | Knapp et al. |
| 6,329,925 B1 | 12/2001 | Skiver et al. |
| 6,330,511 B2 | 12/2001 | Ogura et al. |
| 6,335,548 B1 | 1/2002 | Roberts |
| 6,335,680 B1 | 1/2002 | Matsuoka |
| 6,344,805 B1 | 2/2002 | Yasui et al. |
| 6,348,858 B2 | 2/2002 | Weis et al. |

(56) References Cited

U.S. PATENT DOCUMENTS

| | | |
|---|---|---|
| 6,349,782 B1 | 2/2002 | Sekiya et al. |
| 6,356,206 B1 | 3/2002 | Takenaga et al. |
| 6,356,376 B1 | 3/2002 | Tonar |
| 6,357,883 B1 | 3/2002 | Strumolo et al. |
| 6,359,274 B1 | 3/2002 | Nixon |
| 6,363,326 B1 | 3/2002 | Scully |
| 6,369,701 B1 | 4/2002 | Yoshida et al. |
| 6,379,013 B1 | 4/2002 | Bechtel |
| 6,392,783 B1 | 5/2002 | Lomprey |
| 6,396,040 B1 | 5/2002 | Hill |
| 6,396,397 B1 | 5/2002 | Bos et al. |
| 6,402,328 B1 | 6/2002 | Bechtel |
| 6,403,942 B1 | 6/2002 | Stam |
| 6,407,468 B1 | 6/2002 | Levesque et al. |
| 6,407,847 B1 | 6/2002 | Poll et al. |
| 6,408,247 B1 | 6/2002 | Ichikawa et al. |
| 6,412,959 B1 | 7/2002 | Tseng |
| 6,415,230 B1 | 7/2002 | Maruko et al. |
| 6,420,800 B1 | 7/2002 | Levesque |
| 6,421,081 B1 | 7/2002 | Markus |
| 6,424,272 B1 | 7/2002 | Gutta et al. |
| 6,424,273 B1 | 7/2002 | Gutta et al. |
| 6,424,892 B1 | 7/2002 | Matsuoka |
| 6,426,485 B1 | 7/2002 | Buljajewski |
| 6,428,172 B1 | 8/2002 | Hutzel et al. |
| 6,429,594 B1 | 8/2002 | Stam |
| 6,433,680 B1 | 8/2002 | Ho |
| 6,437,688 B1 | 8/2002 | Kobayashi |
| 6,438,491 B1 | 8/2002 | Farmer |
| 6,441,872 B1 | 8/2002 | Ho |
| 6,441,943 B1 | 8/2002 | Roberts |
| 6,442,465 B2 | 8/2002 | Breed et al. |
| 6,443,585 B1 | 9/2002 | Saccomanno |
| 6,443,602 B1 | 9/2002 | Tanabe et al. |
| 6,447,128 B1 | 9/2002 | Lang et al. |
| 6,452,533 B1 | 9/2002 | Yamabuchi et al. |
| 6,463,369 B2 | 10/2002 | Sadano et al. |
| 6,465,962 B1 | 10/2002 | Fu et al. |
| 6,465,963 B1 | 10/2002 | Turnbull |
| 6,466,701 B1 | 10/2002 | Ejiri et al. |
| 6,469,739 B1 | 10/2002 | Bechtel |
| 6,471,362 B1 | 10/2002 | Carter |
| 6,472,977 B1 | 10/2002 | Pochmuller |
| 6,473,001 B1 | 10/2002 | Blum |
| 6,476,731 B1 | 11/2002 | Miki et al. |
| 6,476,855 B1 | 11/2002 | Yamamoto |
| 6,483,429 B1 | 11/2002 | Yasui et al. |
| 6,483,438 B2 | 11/2002 | Deline et al. |
| 6,487,500 B2 | 11/2002 | Lemelson et al. |
| 6,491,416 B1 | 12/2002 | Strazzanti |
| 6,498,620 B2 | 12/2002 | Schofield et al. |
| 6,501,387 B2 | 12/2002 | Skiver et al. |
| 6,504,142 B2 | 1/2003 | Nixon |
| 6,507,779 B2 | 1/2003 | Breed et al. |
| 6,512,624 B2 | 1/2003 | Tonar |
| 6,515,581 B1 | 2/2003 | Ho |
| 6,515,597 B1 | 2/2003 | Wada et al. |
| 6,520,667 B1 | 2/2003 | Mousseau |
| 6,521,916 B2 | 2/2003 | Roberts |
| 6,522,969 B2 | 2/2003 | Kannonji |
| 6,523,976 B1 | 2/2003 | Turnbull |
| D471,847 S | 3/2003 | Rumsey et al. |
| 6,535,126 B2 | 3/2003 | Lin et al. |
| 6,542,085 B1 | 4/2003 | Yang |
| 6,542,182 B1 | 4/2003 | Chutorash |
| 6,545,598 B1 | 4/2003 | De Villeroche |
| 6,545,794 B2 | 4/2003 | Ash |
| 6,550,943 B2 | 4/2003 | Strazzanti |
| 6,553,130 B2 | 4/2003 | Lemelson et al. |
| 6,558,026 B2 | 5/2003 | Strazzanti |
| 6,559,761 B1 | 5/2003 | Miller et al. |
| 6,572,233 B1 | 6/2003 | North Man et al. |
| 6,580,373 B1 | 6/2003 | Ohashi |
| 6,581,007 B2 | 6/2003 | Hasegawa et al. |
| 6,583,730 B2 | 6/2003 | Lang et al. |
| 6,575,643 B2 | 7/2003 | Takashashi |
| 6,587,573 B1 | 7/2003 | Stam |
| 6,591,192 B2 | 7/2003 | Okamura et al. |
| 6,594,583 B2 | 7/2003 | Ogura et al. |
| 6,594,614 B2 | 7/2003 | Studt et al. |
| 6,606,183 B2 | 8/2003 | Ikai et al. |
| 6,611,202 B2 | 8/2003 | Schofield et al. |
| 6,611,227 B1 | 8/2003 | Nebiyeloul-Kifle |
| 6,611,610 B1 | 8/2003 | Stam et al. |
| 6,611,759 B2 | 8/2003 | Brosche |
| 6,614,387 B1 | 9/2003 | Deadman |
| 6,614,579 B2 | 9/2003 | Roberts et al. |
| 6,616,764 B2 | 9/2003 | Kramer et al. |
| 6,617,564 B2 | 9/2003 | Ockerse et al. |
| 6,618,672 B2 | 9/2003 | Sasaki et al. |
| 6,630,888 B2 | 10/2003 | Lang et al. |
| 6,631,316 B2 | 10/2003 | Stam et al. |
| 6,635,194 B2 | 10/2003 | Kloeppner |
| 6,636,258 B2 | 10/2003 | Strumolo |
| 6,642,840 B2 | 11/2003 | Lang et al. |
| 6,642,851 B2 | 11/2003 | Deline et al. |
| 6,648,477 B2 | 11/2003 | Hutzel et al. |
| 6,650,457 B2 | 11/2003 | Busscher et al. |
| 6,657,767 B2 | 12/2003 | Bonardi |
| 6,665,592 B2 | 12/2003 | Kodama |
| 6,670,207 B1 | 12/2003 | Roberts |
| 6,670,910 B2 | 12/2003 | Delcheccolo et al. |
| 6,674,370 B2 | 1/2004 | Rodewald et al. |
| 6,675,075 B1 | 1/2004 | Engelsberg et al. |
| 6,677,986 B1 | 1/2004 | Pöchmüller |
| 6,683,539 B2 | 1/2004 | Trajkovic et al. |
| 6,683,969 B1 | 1/2004 | Nishigaki et al. |
| 6,690,268 B2 | 2/2004 | Schofield et al. |
| 6,690,413 B1 | 2/2004 | Moore |
| 6,693,517 B2 | 2/2004 | McCarty et al. |
| 6,693,518 B2 | 2/2004 | Kumata |
| 6,693,519 B2 | 2/2004 | Keirstead |
| 6,693,524 B1 | 2/2004 | Payne |
| 6,700,692 B2 | 3/2004 | Tonar |
| 6,717,610 B1 | 4/2004 | Bos et al. |
| 6,727,808 B1 | 4/2004 | Uselmann et al. |
| 6,727,844 B1 | 4/2004 | Zimmermann et al. |
| 6,731,332 B1 | 5/2004 | Yasui et al. |
| 6,734,807 B2 | 5/2004 | King |
| 6,737,964 B2 | 5/2004 | Samman et al. |
| 6,738,088 B1 | 5/2004 | Uskolovsky et al. |
| 6,744,353 B2 | 6/2004 | Sjonell |
| 6,746,122 B2 | 6/2004 | Knox |
| D493,131 S | 7/2004 | Lawlor et al. |
| D493,394 S | 7/2004 | Lawlor et al. |
| 6,768,566 B2 | 7/2004 | Walker |
| 6,772,057 B2 | 8/2004 | Breed et al. |
| 6,774,988 B2 | 8/2004 | Stam |
| 6,781,738 B2 | 8/2004 | Kikuchi et al. |
| D498,446 S | 11/2004 | Bradley |
| 6,816,145 B1 | 11/2004 | Evanicky |
| 6,816,297 B1 | 11/2004 | Tonar |
| D499,678 S | 12/2004 | Bradley |
| 6,846,098 B2 | 1/2005 | Bourdelais et al. |
| 6,847,487 B2 | 1/2005 | Burgner |
| 6,853,413 B2 | 2/2005 | Larson |
| 6,861,809 B2 | 3/2005 | Stam |
| 6,870,656 B2 | 3/2005 | Tonar et al. |
| 6,902,284 B2 | 6/2005 | Hutzel et al. |
| 6,902,307 B2 | 6/2005 | Strazzanti |
| 6,912,001 B2 | 6/2005 | Okamoto et al. |
| 6,913,375 B2 | 7/2005 | Strazzanti |
| 6,923,080 B1 | 8/2005 | Dobler et al. |
| 6,930,737 B2 | 8/2005 | Weindorf et al. |
| 6,934,080 B2 | 8/2005 | Saccomanno et al. |
| 6,946,978 B2 | 9/2005 | Schofield |
| 6,968,273 B2 | 11/2005 | Ockerse |
| 7,012,543 B2 | 3/2006 | Deline et al. |
| 7,038,577 B2 | 5/2006 | Pawlicki et al. |
| 7,042,616 B2 | 5/2006 | Tonar et al. |
| 7,046,448 B2 | 5/2006 | Burgner |
| 7,064,882 B2 | 6/2006 | Tonar |
| 7,175,291 B1 | 2/2007 | Li |
| 7,255,465 B2 | 8/2007 | Deline et al. |

(56) References Cited

U.S. PATENT DOCUMENTS

| | | |
|---|---|---|
| 7,262,406 B2 | 8/2007 | Heslin et al. |
| 7,265,342 B2 | 9/2007 | Heslin et al. |
| D553,061 S | 10/2007 | Schmidt et al. |
| 7,285,903 B2 | 10/2007 | Cull et al. |
| 7,287,868 B2 | 10/2007 | Carter |
| D556,105 S | 11/2007 | Carter et al. |
| D556,106 S | 11/2007 | Carter et al. |
| 7,292,208 B1 | 11/2007 | Park et al. |
| 7,311,428 B2 | 12/2007 | Deline et al. |
| 7,321,112 B2 | 1/2008 | Stam et al. |
| 7,324,261 B2 | 1/2008 | Tonar et al. |
| 7,342,707 B2 | 3/2008 | Roberts |
| 7,360,932 B2 | 4/2008 | Liken et al. |
| 7,417,221 B2 | 8/2008 | Creswick et al. |
| 7,417,717 B2 | 8/2008 | Pack |
| 7,446,650 B2 | 11/2008 | Scholfield et al. |
| 7,467,883 B2 | 12/2008 | Deline et al. |
| 7,468,651 B2 | 12/2008 | Deline et al. |
| 7,505,047 B2 | 3/2009 | Yoshimura |
| 7,533,998 B2 | 5/2009 | Schofield et al. |
| 7,548,291 B2 | 6/2009 | Lee et al. |
| 7,565,006 B2 | 7/2009 | Stam et al. |
| 7,567,291 B2 | 7/2009 | Bechtel et al. |
| 7,579,940 B2 | 8/2009 | Schofield et al. |
| 7,592,563 B2 | 9/2009 | Wissenbach |
| 7,619,508 B2 | 11/2009 | Lynam et al. |
| 7,653,215 B2 | 1/2010 | Stam |
| 7,658,521 B2 | 2/2010 | Deline et al. |
| 7,663,798 B2 | 2/2010 | Tonar |
| 7,683,326 B2 | 3/2010 | Stam et al. |
| 7,688,495 B2 | 3/2010 | Tonar et al. |
| 7,706,046 B2 | 4/2010 | Bauer et al. |
| 7,711,479 B2 | 5/2010 | Taylor et al. |
| 7,719,408 B2 | 5/2010 | Deward et al. |
| 7,720,580 B2 | 5/2010 | Higgins-Luthman |
| 7,746,534 B2 | 6/2010 | Tonar et al. |
| 7,815,326 B2 | 10/2010 | Blank et al. |
| 7,817,020 B2 | 10/2010 | Turnbull et al. |
| 7,821,696 B2 | 10/2010 | Tonar et al. |
| 7,830,583 B2 | 11/2010 | Neuman et al. |
| 7,864,399 B2 | 1/2011 | McCabe et al. |
| 7,877,175 B2 | 1/2011 | Higgins-Luthman |
| 7,881,496 B2 | 2/2011 | Camilleri et al. |
| 7,881,839 B2 | 2/2011 | Stam et al. |
| 7,888,629 B2 | 2/2011 | Heslin et al. |
| 7,914,188 B2 | 3/2011 | Deline et al. |
| 7,972,045 B2 | 7/2011 | Schofield |
| 7,978,393 B2 | 7/2011 | Tonar et al. |
| 7,994,471 B2 | 8/2011 | Heslin et al. |
| 8,031,225 B2 | 10/2011 | Watanabe et al. |
| 8,035,881 B2 | 10/2011 | Luten et al. |
| 8,045,760 B2 | 10/2011 | Stam et al. |
| 8,059,235 B2 | 11/2011 | Utsumi et al. |
| 8,063,753 B2 | 11/2011 | DeLine et al. |
| 8,090,153 B2 | 1/2012 | Schofield et al. |
| 8,095,310 B2 | 1/2012 | Taylor et al. |
| 8,100,568 B2 | 1/2012 | Deline et al. |
| 8,116,929 B2 | 2/2012 | Higgins-Luthman |
| 8,120,652 B2 | 2/2012 | Bechtel et al. |
| 8,142,059 B2 | 3/2012 | Higgins-Luthman et al. |
| 8,162,518 B2 | 4/2012 | Schofield |
| D659,617 S | 5/2012 | Brockington et al. |
| 8,194,133 B2 | 6/2012 | DeWind et al. |
| 8,201,800 B2 | 6/2012 | Filipiak |
| 8,203,433 B2 | 6/2012 | Deuber et al. |
| 8,217,830 B2 | 7/2012 | Lynam |
| 8,222,588 B2 | 7/2012 | Schofield et al. |
| 8,237,909 B2 | 8/2012 | Ostreko et al. |
| 8,258,433 B2 | 9/2012 | Byers et al. |
| 8,282,226 B2 | 10/2012 | Blank et al. |
| 8,325,028 B2 | 12/2012 | Schofield et al. |
| 8,482,683 B2 | 7/2013 | Hwang et al. |
| 8,520,069 B2 | 8/2013 | Haler |
| 8,564,662 B2 | 10/2013 | Busch et al. |
| 8,779,910 B2 | 7/2014 | DeLine et al. |
| D712,325 S | 9/2014 | Bohanan et al. |
| 8,836,888 B2 | 9/2014 | Minikey, Jr. et al. |
| D724,508 S | 3/2015 | Bohanan et al. |
| D724,509 S | 3/2015 | Bohanan et al. |
| 2001/0019356 A1 | 9/2001 | Takeda et al. |
| 2001/0022616 A1 | 9/2001 | Rademacher et al. |
| 2001/0026316 A1 | 10/2001 | Senatore |
| 2001/0045981 A1 | 11/2001 | Gloger et al. |
| 2002/0040962 A1 | 4/2002 | Schofield et al. |
| 2002/0044065 A1 | 4/2002 | Quist et al. |
| 2002/0191127 A1 | 12/2002 | Roberts et al. |
| 2003/0002165 A1 | 1/2003 | Mathias et al. |
| 2003/0007261 A1 | 1/2003 | Hutzel et al. |
| 2003/0016125 A1 | 1/2003 | Lang et al. |
| 2003/0016287 A1 | 1/2003 | Nakayama et al. |
| 2003/0025596 A1 | 2/2003 | Lang et al. |
| 2003/0025597 A1 | 2/2003 | Schofield |
| 2003/0030546 A1 | 2/2003 | Tseng |
| 2003/0030551 A1 | 2/2003 | Ho |
| 2003/0030724 A1 | 2/2003 | Okamoto |
| 2003/0035050 A1 | 2/2003 | Mizusawa |
| 2003/0043269 A1 | 3/2003 | Park |
| 2003/0052969 A1 | 3/2003 | Satoh et al. |
| 2003/0058338 A1 | 3/2003 | Kawauchi et al. |
| 2003/0067383 A1 | 4/2003 | Yang |
| 2003/0076415 A1 | 4/2003 | Strumolo |
| 2003/0080877 A1 | 5/2003 | Takagi et al. |
| 2003/0085806 A1 | 5/2003 | Samman et al. |
| 2003/0088361 A1 | 5/2003 | Sekiguchi |
| 2003/0090568 A1 | 5/2003 | Pico |
| 2003/0090569 A1 | 5/2003 | Poechmueller |
| 2003/0090570 A1 | 5/2003 | Takagi et al. |
| 2003/0098908 A1 | 5/2003 | Misaiji et al. |
| 2003/0103141 A1 | 6/2003 | Bechtel et al. |
| 2003/0103142 A1 | 6/2003 | Hitomi et al. |
| 2003/0117522 A1 | 6/2003 | Okada |
| 2003/0122929 A1 | 7/2003 | Minaudo et al. |
| 2003/0122930 A1 | 7/2003 | Schofield et al. |
| 2003/0133014 A1 | 7/2003 | Mendoza |
| 2003/0137586 A1 | 7/2003 | Lewellen |
| 2003/0141965 A1 | 7/2003 | Gunderson et al. |
| 2003/0146831 A1 | 8/2003 | Berberich et al. |
| 2003/0169158 A1 | 9/2003 | Paul, Jr. |
| 2003/0179293 A1 | 9/2003 | Oizumi |
| 2003/0202096 A1 | 10/2003 | Kim |
| 2003/0202357 A1 | 10/2003 | Strazzanti |
| 2003/0214576 A1 | 11/2003 | Koga |
| 2003/0214584 A1 | 11/2003 | Ross, Jr. |
| 2003/0214733 A1 | 11/2003 | Fujikawa et al. |
| 2003/0222793 A1 | 12/2003 | Tanaka et al. |
| 2003/0222983 A1 | 12/2003 | Nobori et al. |
| 2003/0227546 A1 | 12/2003 | Hilborn et al. |
| 2004/0004541 A1 | 1/2004 | Hong |
| 2004/0027695 A1 | 1/2004 | Lin |
| 2004/0032321 A1 | 2/2004 | McMahon et al. |
| 2004/0036768 A1 | 2/2004 | Green |
| 2004/0051634 A1 | 3/2004 | Schofield et al. |
| 2004/0056955 A1 | 3/2004 | Berberich et al. |
| 2004/0057131 A1 | 3/2004 | Hutzel et al. |
| 2004/0064241 A1 | 4/2004 | Sekiguchi |
| 2004/0066285 A1 | 4/2004 | Sekiguchi |
| 2004/0075603 A1 | 4/2004 | Kodama |
| 2004/0080404 A1 | 4/2004 | White |
| 2004/0080431 A1 | 4/2004 | White |
| 2004/0085196 A1 | 5/2004 | Milelr et al. |
| 2004/0090314 A1 | 5/2004 | Iwamoto |
| 2004/0090317 A1 | 5/2004 | Rothkop |
| 2004/0096082 A1 | 5/2004 | Nakai et al. |
| 2004/0098196 A1 | 5/2004 | Sekiguchi |
| 2004/0107030 A1 | 6/2004 | Nishira et al. |
| 2004/0107617 A1 | 6/2004 | Shoen et al. |
| 2004/0109060 A1 | 6/2004 | Ishii |
| 2004/0114039 A1 | 6/2004 | Ishikura |
| 2004/0119668 A1 | 6/2004 | Homma et al. |
| 2004/0125905 A1 | 7/2004 | Vlasenko et al. |
| 2004/0202001 A1 | 10/2004 | Roberts et al. |
| 2005/0140855 A1 | 6/2005 | Utsumi |
| 2005/0237440 A1 | 10/2005 | Sugimura et al. |
| 2006/0007550 A1 | 1/2006 | Tonar et al. |

(56) References Cited

U.S. PATENT DOCUMENTS

| | | |
|---|---|---|
| 2006/0115759 A1 | 6/2006 | Kim et al. |
| 2006/0139953 A1 | 6/2006 | Chou et al. |
| 2006/0158899 A1 | 7/2006 | Ayabe et al. |
| 2007/0146481 A1 | 6/2007 | Chen et al. |
| 2007/0171037 A1 | 7/2007 | Schofield et al. |
| 2008/0068520 A1 | 3/2008 | Minikey, Jr. et al. |
| 2008/0192132 A1 | 8/2008 | Bechtel et al. |
| 2008/0247192 A1 | 10/2008 | Hoshi et al. |
| 2008/0294315 A1 | 11/2008 | Breed |
| 2008/0302657 A1 | 12/2008 | Luten et al. |
| 2009/0015736 A1 | 1/2009 | Weller et al. |
| 2009/0141516 A1 | 6/2009 | Wu et al. |
| 2009/0296190 A1 | 12/2009 | Anderson et al. |
| 2010/0110553 A1 | 5/2010 | Anderson et al. |
| 2010/0201896 A1 | 8/2010 | Ostreko et al. |
| 2010/0277786 A1 | 11/2010 | Anderson et al. |
| 2011/0168687 A1 | 7/2011 | Door |
| 2011/0176323 A1 | 7/2011 | Skiver et al. |
| 2011/0181727 A1 | 7/2011 | Weller et al. |
| 2012/0038964 A1 | 2/2012 | De Wind et al. |
| 2012/0069444 A1 | 3/2012 | Campbell et al. |
| 2012/0229882 A1 | 9/2012 | Fish, Jr. et al. |
| 2012/0236388 A1 | 9/2012 | De Wind et al. |
| 2013/0028473 A1 | 1/2013 | Hilldore et al. |
| 2013/0279014 A1* | 10/2013 | Fish, Jr. ............ G02B 27/0149 359/630 |
| 2014/0022390 A1 | 1/2014 | Blank et al. |
| 2014/0043479 A1 | 2/2014 | Busch et al. |
| 2014/0192431 A1 | 7/2014 | Sloterbeek et al. |
| 2014/0347488 A1 | 11/2014 | Tazaki et al. |

FOREIGN PATENT DOCUMENTS

| | | |
|---|---|---|
| EP | 0899157 A1 | 3/1999 |
| EP | 0899157 B1 | 10/2004 |
| EP | 2393691 B1 | 5/2014 |
| GB | 2338363 | 12/1999 |
| JP | 1178693 | 3/1999 |
| JP | 2001075485 A | 3/2001 |
| JP | 2002096685 A | 4/2002 |
| JP | 2002200936 A | 7/2002 |
| JP | 2005148119 | 6/2005 |
| JP | 2005327600 | 11/2005 |
| JP | 2008139819 A | 6/2008 |
| JP | 2009265248 A | 11/2009 |
| JP | 2009542505 A | 12/2009 |
| JP | 2013244753 | 12/2013 |
| WO | 9621581 | 7/1996 |
| WO | 2007103573 A2 | 9/2007 |
| WO | 2010090964 | 8/2010 |

OTHER PUBLICATIONS

Palalau et al., "FPD Evaluation for Automotive Application," Proceedings of the Vehicle Display Symposium, Nov. 2, 1995, pp. 97-103, Society for Information Display, Detroit Chapter, Santa Ana, CA.

Adler, "A New Automotive AMLCD Module," Proceedings of the Vehicle Display Symposium, Nov. 2, 1995, pp. 67-71, Society for Information Display, Detroit Chapter, Santa Ana, CA.

Sayer, et al., "In-Vehicle Displays for Crash Avoidance and Navigation Systems,"Proceedings of the Vehicle Display Symposium, Sep. 18, 1996, pp. 39-42, Society for Information Display, Detroit Chapter, Santa Ana, CA.

Knoll, et al., "Application of Graphic Displays in Automobiles," SID 87 Digest, 1987, pp. 41-44, 5A.2.

Terada, et al., "Development of Central Information Display of Automotive Application," SID 89 Digest, 1989, pp. 192-195, Society for Information Display, Detroit Center, Santa Ana, CA.

Thomsen, et al., "AMLCD Design Considerations for Avionics and Vetronics Applications," Proceedings of the 5th Annual Flat Panel Display Strategic and Technical Symposium, Sep. 9-10, 1998, pp. 139-145, Society for Information Display, Metropolitan Detroit Chapter, CA.

Knoll, et al., "Conception of an Integrated Driver Information System," SID International Symposium Digest of Technical Papers, 1990, pp. 126-129, Society for Information Display, Detroit Center, Santa Ana, CA.

Vincen, "An Analysis of Direct-View FPDs for Automotive Multi-Media Applications,"Proceedings of the 6th Annual Strategic and Technical Symposium "Vehicular Applications of Displays and Microsensors," Sep. 22-23, 1999, pp. 39-46, Society for Information Display, Metropolitan Detroit Chapter, San Jose, CA.

Zuk, et al., "Flat Panel Display Applications in Agriculture Equipment," Proceedings of the 5th Annual Flat Panel Display Strategic and Technical Symposium, Sep. 9-10, 1998, pp. 125-130, Society for Information Display, Metropolitan Detroit Chapter, CA.

Vijan, et al., "A 1.7-Mpixel Full-Color Diode Driven AM-LCD," SID International Symposium, 1990, pp. 530-533, Society for Information Display, Playa del Rey, CA.

Vincen, "The Automotive Challenge to Active Matrix LCD Technology," Proceedings of the Vehicle Display Symposium, 1996, pp. 17-21, Society for Information Display, Detroit Center, Santa Ana, CA.

CORSI, et al., "Reconfigurable Displays Used as Primary Automotive Instrumentation," SAE Technical Paper Series, 1989, pp. 13-18, Society of Automotive Engineers, Inc., Warrendale, PA.

Schumacher, "Automotive Display Trends," SID 96 Digest, 1997, pp. 1-6, Delco Electronics Corp., Kokomo, IN.

Knoll, "The Use of Displays in Automotive Applications," Journal of the SID 5/3 1997, pp. 165-172, 315-316, Stuttgart, Germany.

Donofrio, "Looking Beyond the Dashboard," SID 2002, pp. 30-34, Ann Arbor, MI.

Stone, "Automotive Display Specification," Proceedings of the Vehicle Display Symposium, 1995, pp. 93-96, Society for Information Display, Detroit Center, Santa Ana, CA.

* cited by examiner

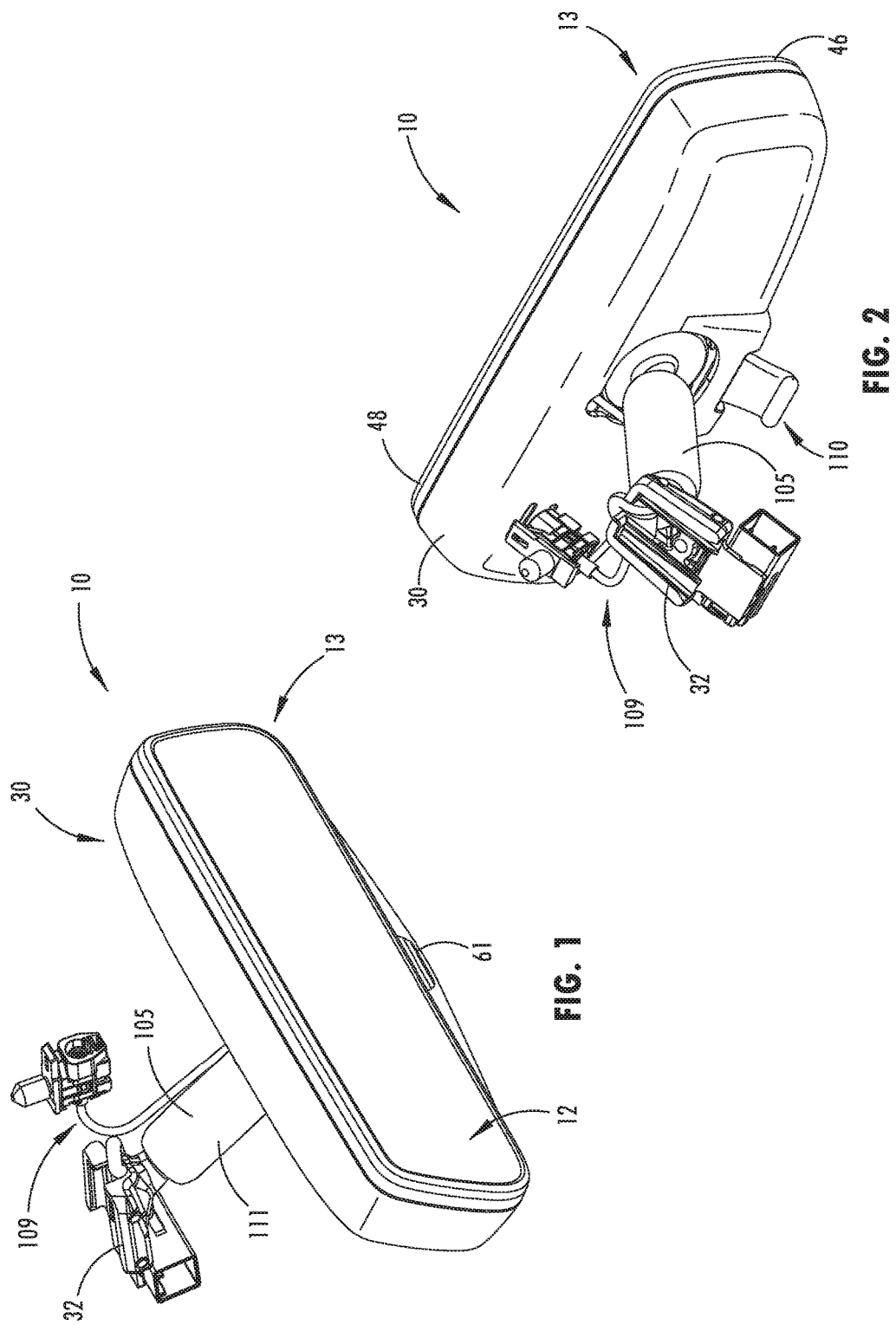

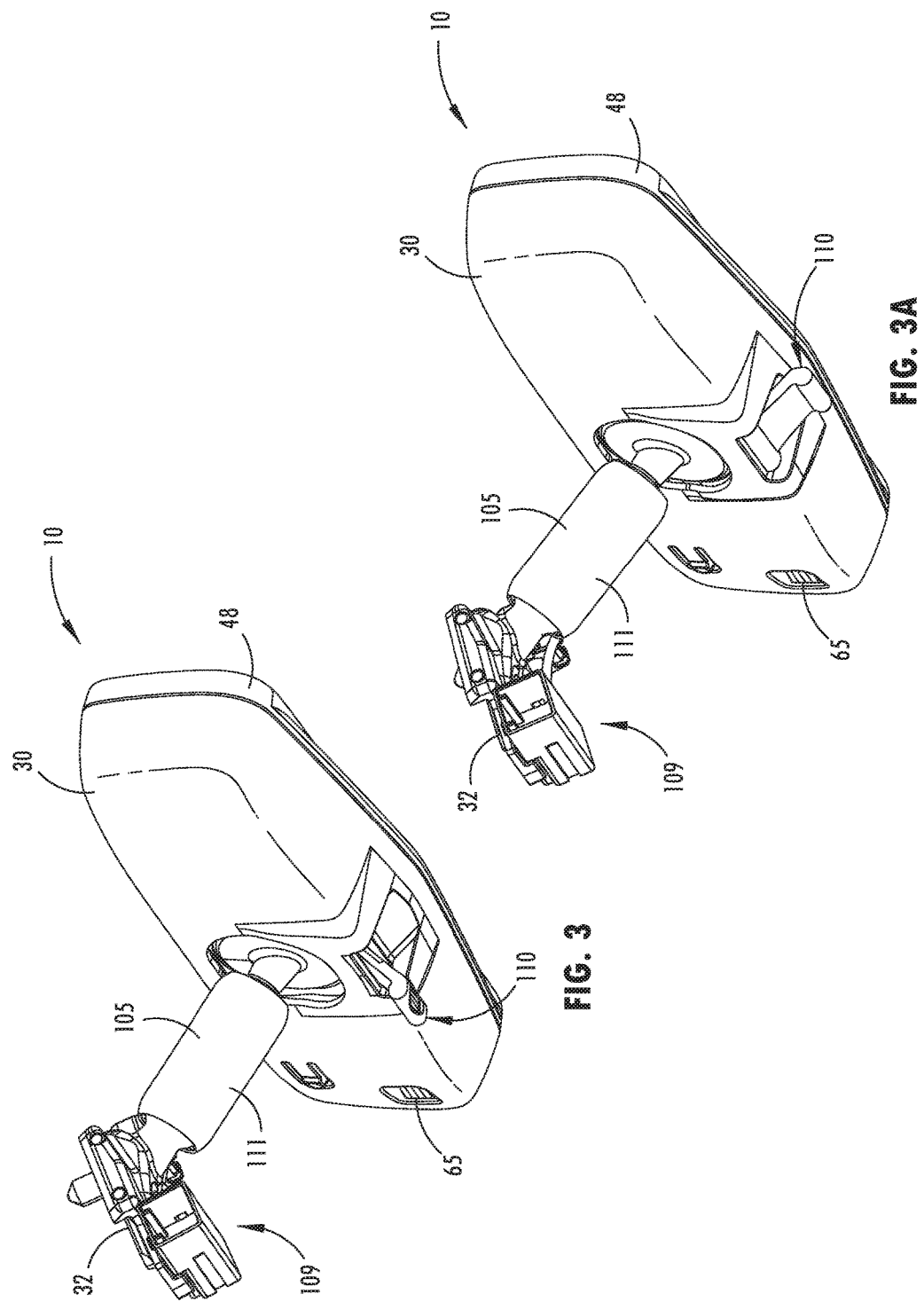

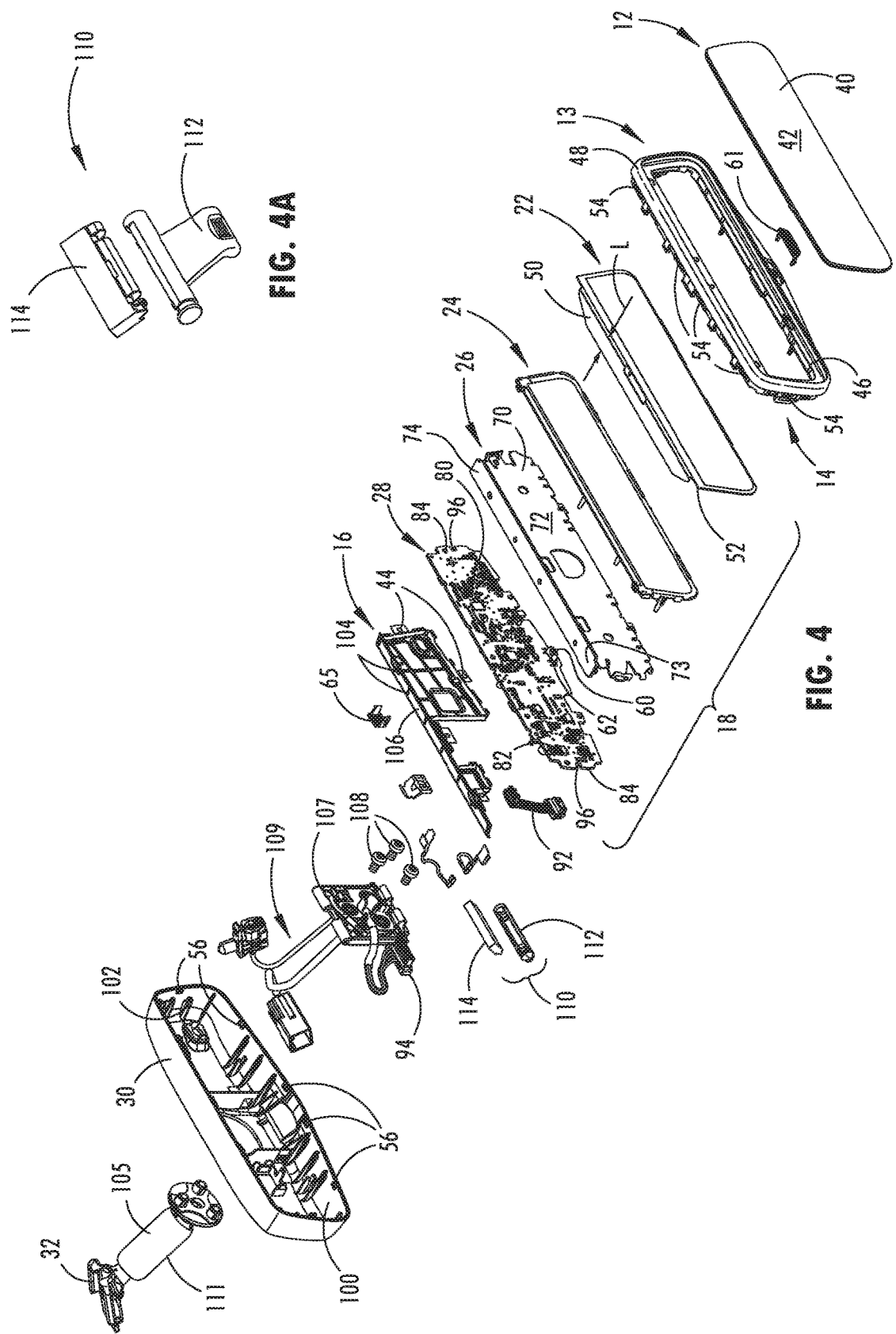

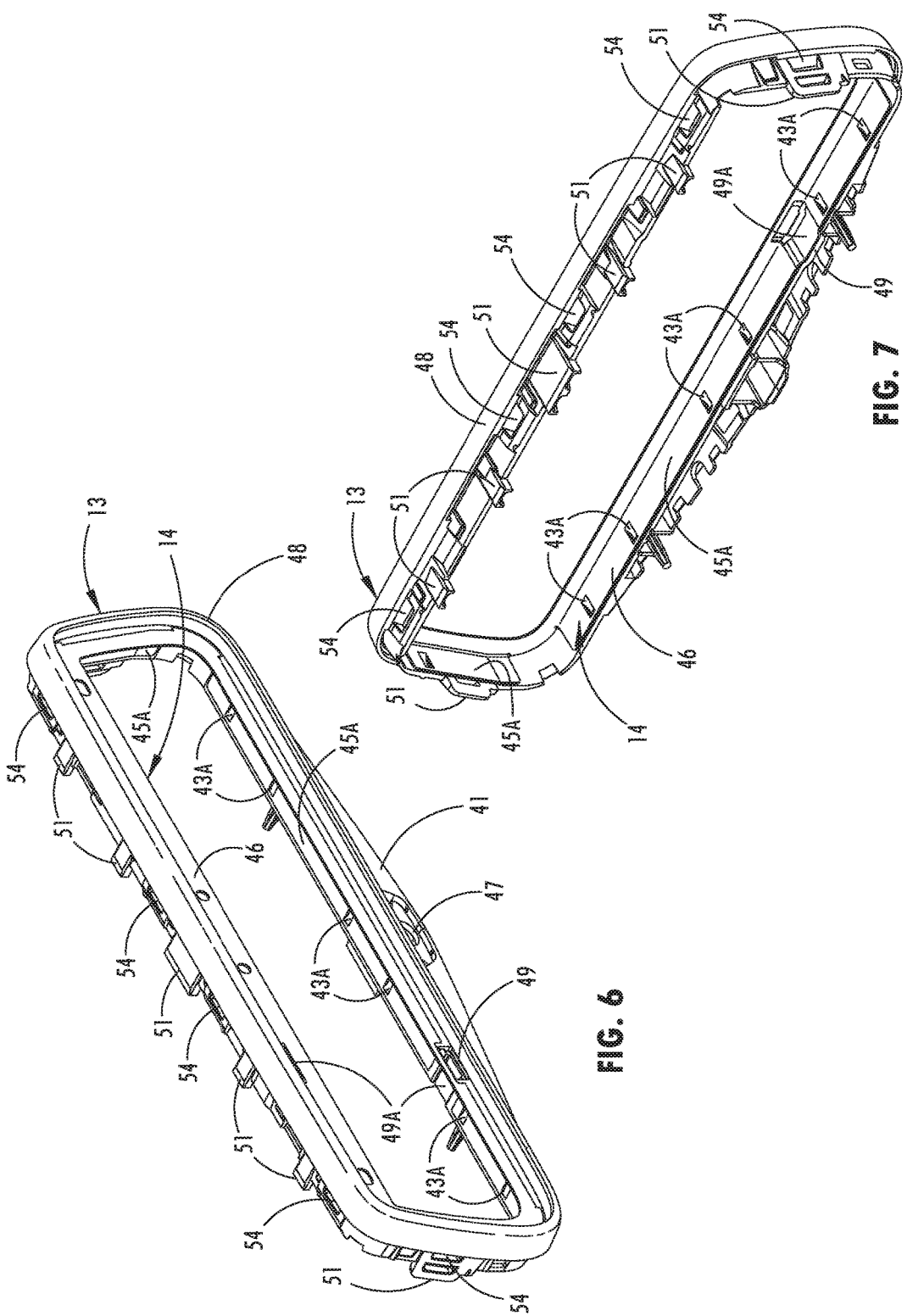

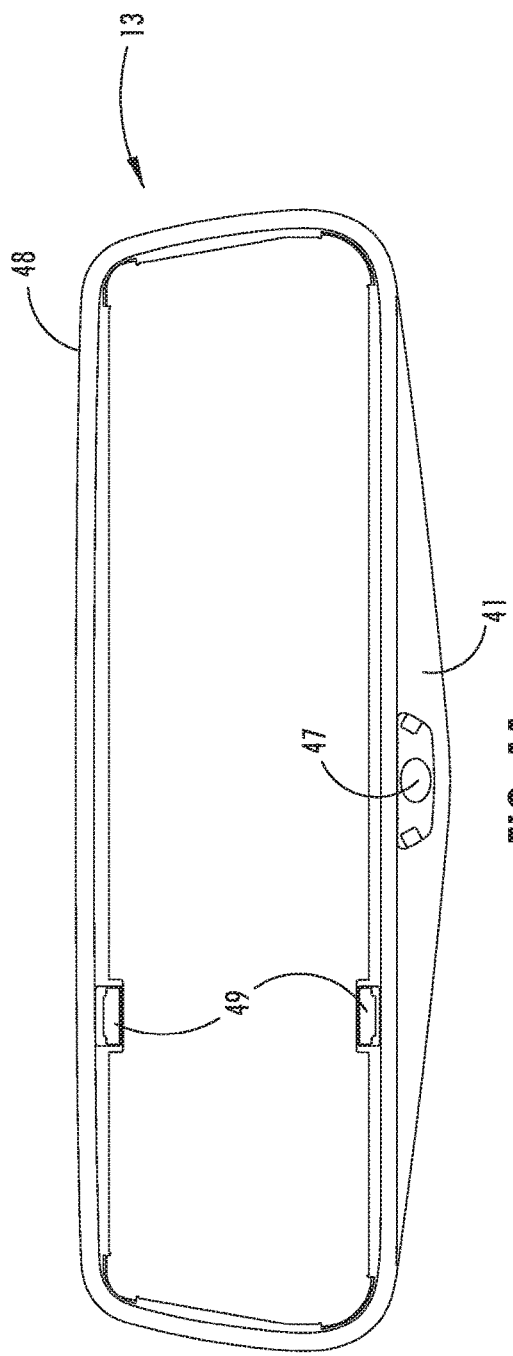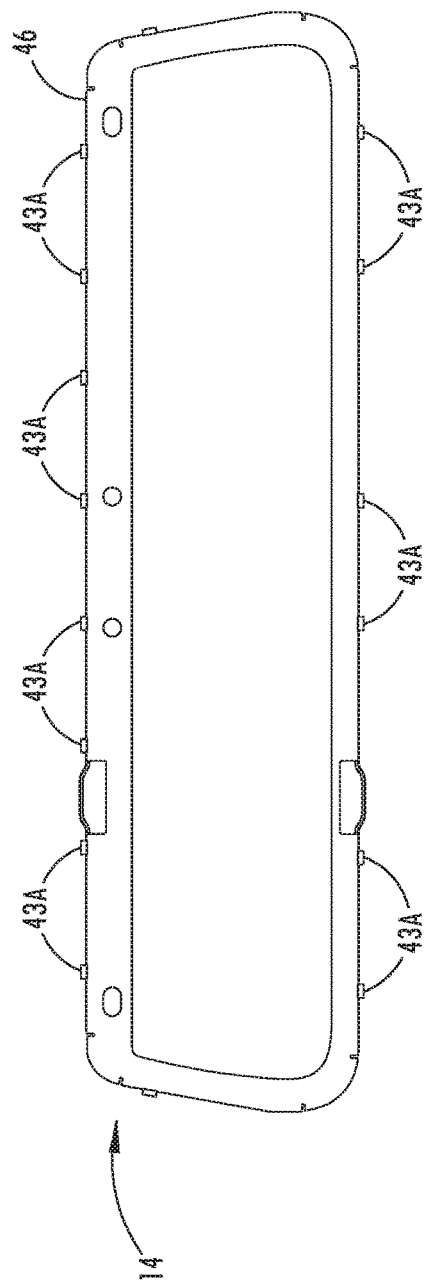

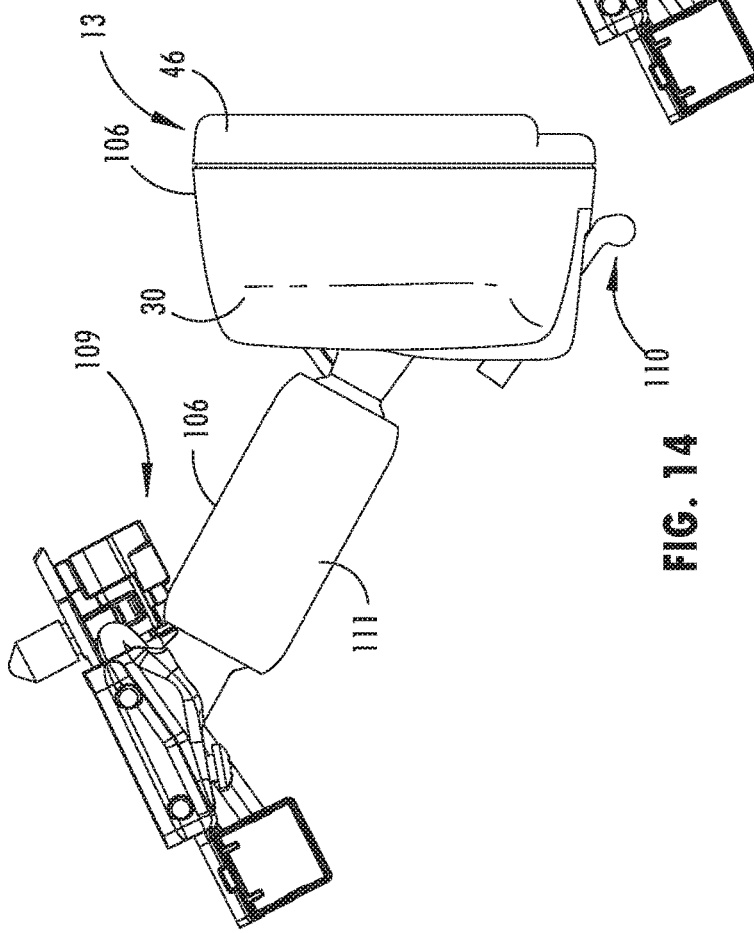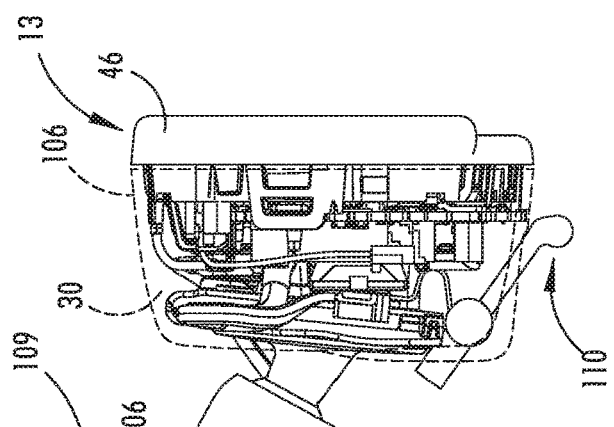

DISPLAY MIRROR ASSEMBLY WITH AN RF SHIELD BEZEL

CROSS-REFERENCE TO RELATED APPLICATION

This application claims priority to and the benefit under 37 U.S.C. § 119(e) of U.S. Provisional Application No. 62/086,841, filed on Dec. 3, 2014, entitled "DISPLAY MIRROR ASSEMBLY," the disclosure of which is hereby incorporated herein by reference in its entirety.

BACKGROUND OF THE DISCLOSURE

The present disclosure generally relates to a rearview device system, and more particularly, to a display mirror assembly having a partially reflective, partially transmissive element and a display behind the reflective element.

SUMMARY OF THE DISCLOSURE

One aspect of the disclosure includes a display mirror assembly for a vehicle having a housing. A glass element is operably coupled with the housing. A display module is mounted between the glass element and the housing, and includes a display, an optic block, and a printed circuit board. The display module is configured to be turned to an on state and an off state. A peripheral support is disposed proximate a periphery of the glass element and is configured to retain the glass element against the display module. The peripheral support includes a radio frequency shield integral therewith. An actuator device is disposed on a bottom surface of the housing and is operably coupled with the glass element. The actuator device is adjustable to tilt the glass element in one direction, thereby moving the glass element to an off-axis position which approximately simultaneously changes the on/off state of the display module. The actuator device is also adjustable to tilt the glass element in another direction, thereby moving the glass element to an on-axis position which approximately simultaneously changes the on/off state of the display module.

Another aspect of the disclosure includes a display mirror assembly for a vehicle having a partially reflective, partially transmissive element. A display module is operably coupled with the partially reflective, partially transmissive element and is configured to be turned to an on state and an off state. A radio frequency shield is formed from a metallic material and securely engaged with the polymeric bezel. The radio frequency shield includes an internal peripheral wall that abuts a rear of the partially reflective, partially transmissive element. An actuator device is operably coupled with the partially reflective, partially transmissive element. The actuator device is adjustable to tilt the partially reflective, partially transmissive element to an off-axis position which approximately simultaneously changes the on/off state of the display module. The actuator device is also adjustable to tilt the partially reflective, partially transmissive element to an on-axis position which approximately simultaneously changes the on/off state of the display module.

Yet another aspect of the disclosure includes a display mirror assembly for a vehicle having a housing. An electro-optic element is operably coupled with the housing. A display module is mounted at least partially between the electro-optic element and the housing and operably coupled to a printed circuit board. The display module is configured to be turned to an on state and an off state. A bezel is disposed about a periphery of the glass element and is configured to retain the glass element against the display module. The bezel is operably coupled with a radio frequency shield disposed between the glass element and the display module.

These and other features, advantages, and objects of the present disclosure will be further understood and appreciated by those skilled in the art by reference to the following specification, claims, and appended drawings.

BRIEF DESCRIPTION OF THE DRAWINGS

FIG. 1 is a top front perspective view of a display mirror assembly for a vehicle;

FIG. 2 is a top rear perspective view of the display mirror assembly of FIG. 1;

FIG. 3 is a bottom rear perspective view of the display mirror assembly of FIG. 1 with the actuator in a first position;

FIG. 3A is a bottom rear perspective view of the display mirror assembly of FIG. 1 with the actuator in a second position;

FIG. 4 is a partially exploded front perspective view of the display mirror assembly of FIG. 1;

FIG. 4A is a partially exploded top perspective view of an actuator for use in the full display mirror of FIG. 1;

FIG. 6 is a front perspective view of one embodiment of a composite bezel and radio frequency shield of the present disclosure;

FIG. 7 is a rear top perspective view of the composite of FIG. 6;

FIG. 11 is a front elevational view of one embodiment of a bezel of the present disclosure;

FIG. 12 is a front elevational view of one embodiment of a radio frequency shield of the present disclosure;

FIG. 14 is a side elevational view of the display mirror assembly of FIG. 1 with the actuator in a second position; and FIG. 14A is a side elevational view of the display mirror assembly of FIG. 1 with the actuator in the second position and the cover in phantom.

DETAILED DESCRIPTION

Figure 5:
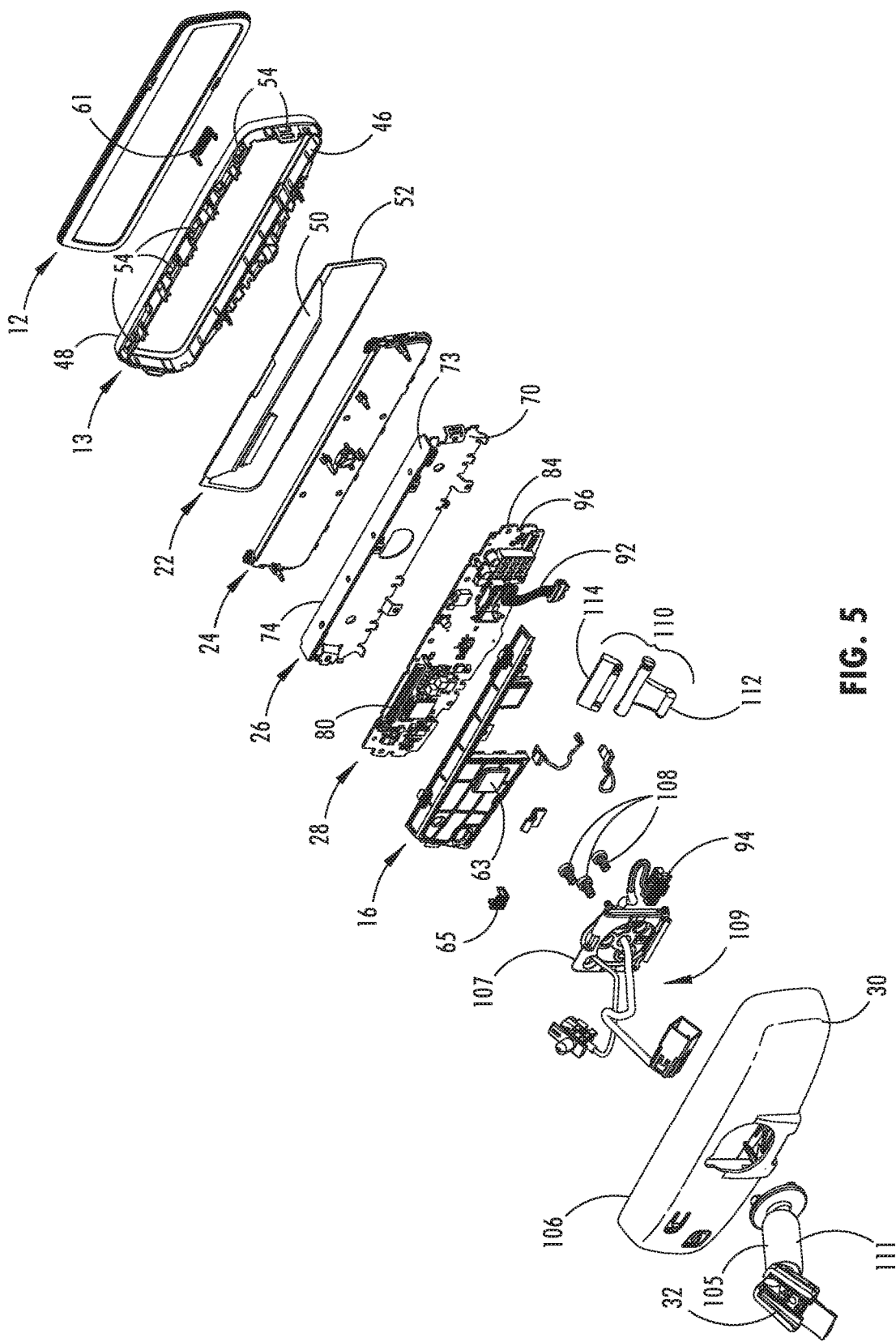
FIG. 5 is a partially exploded front perspective view of the display mirror assembly of FIG. 1.
Figure 8:
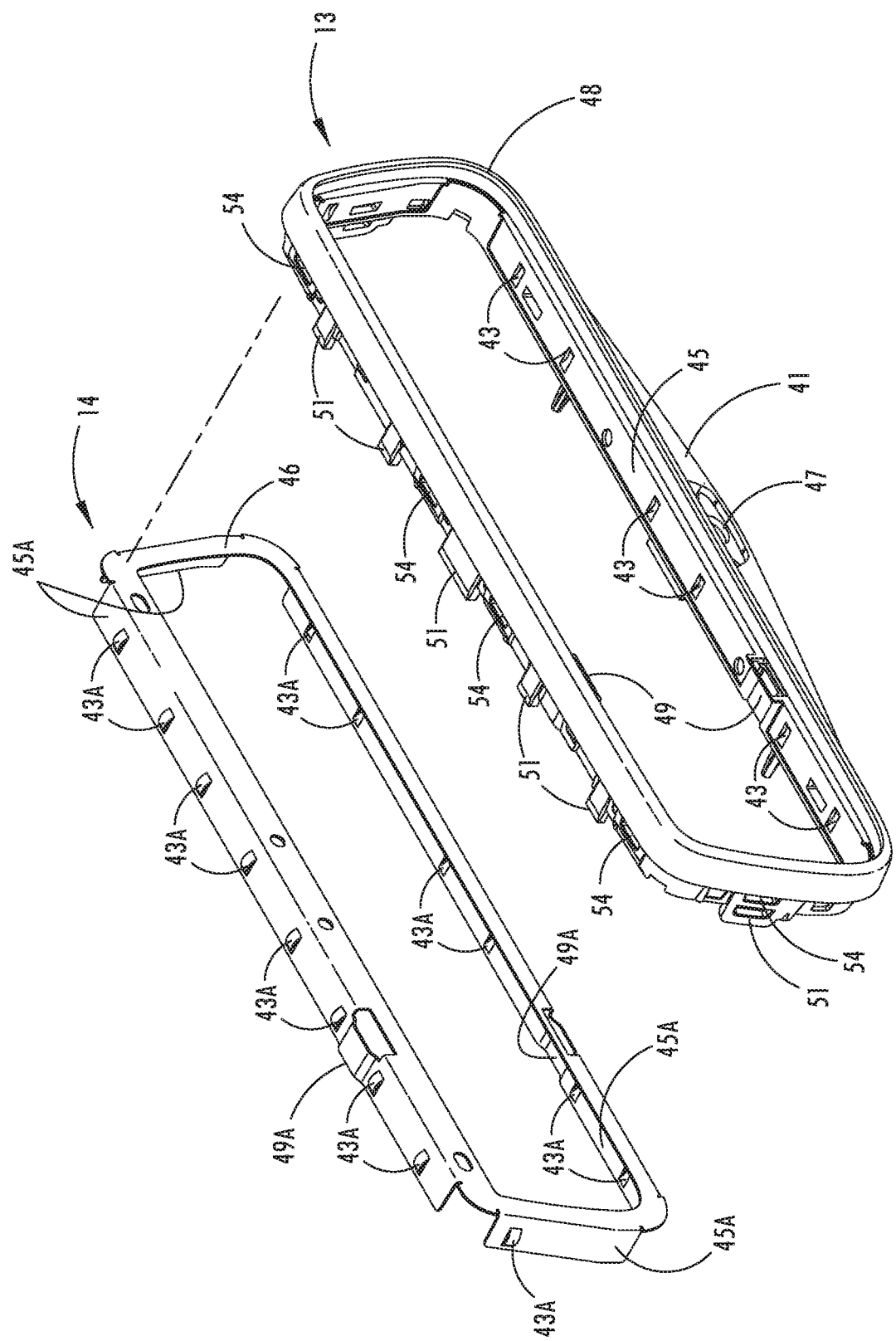
FIG. 8 is an exploded top perspective exploded view of the composite of FIG. 6.
Figure 9:
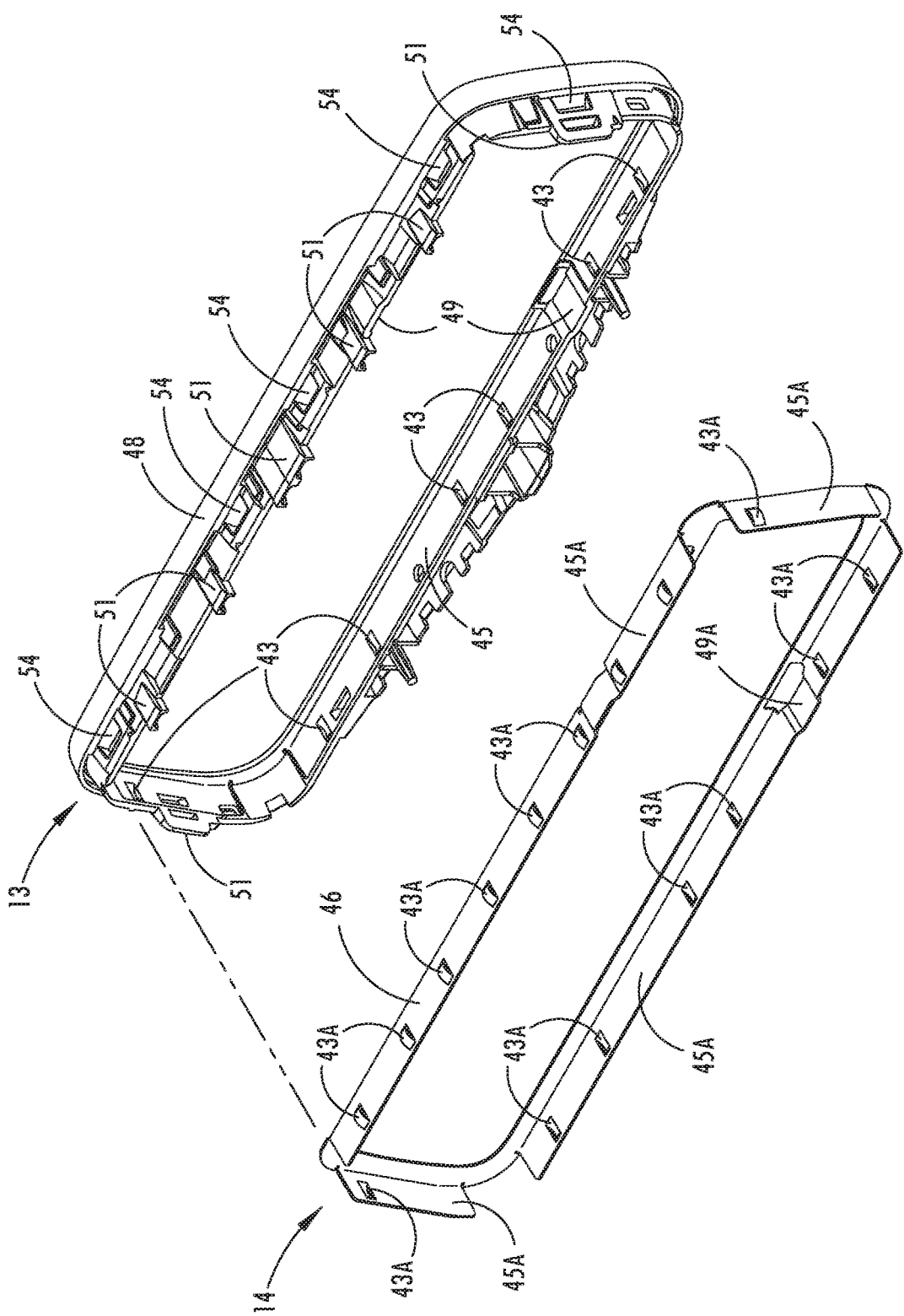
FIG. 9 is an exploded rear top perspective view of the composite of FIG. 6.
Figure 10:
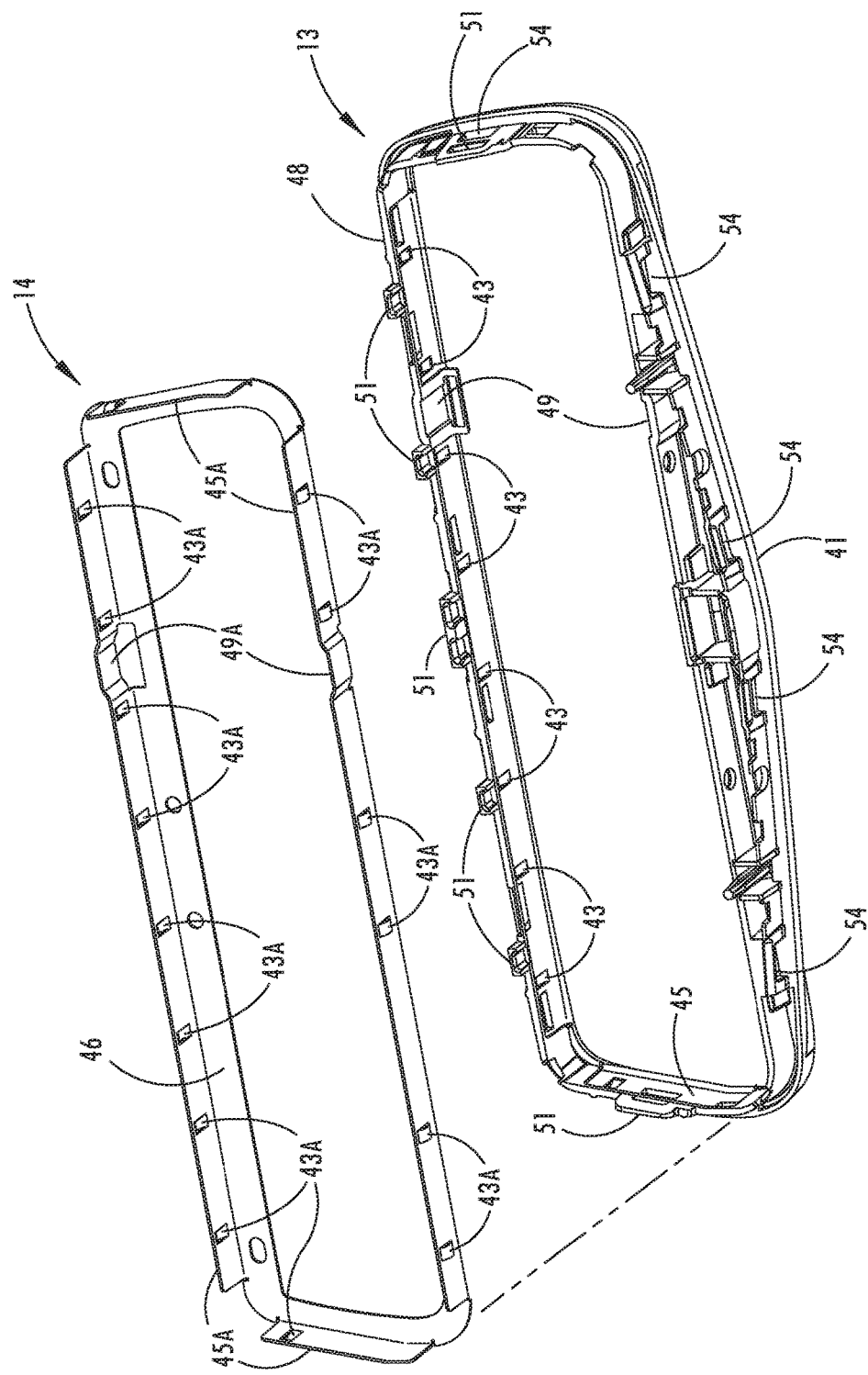
FIG. 10 is an exploded bottom perspective view of the composite of FIG. 6.

The present illustrated embodiments reside primarily in combinations of method steps and apparatus components related to a display mirror. Accordingly, the apparatus components and method steps have been represented, where appropriate, by conventional symbols in the drawings, showing only those specific details that are pertinent to understanding the embodiments of the present disclosure so as not to obscure the disclosure with details that will be readily apparent to those of ordinary skill in the art having the benefit of the description herein. Further, like numerals in the description and drawings represent like elements.

For purposes of description herein, the terms "upper," "lower," "right," "left," "rear," "front," "vertical," "horizontal," and derivatives thereof shall relate to the disclosure as oriented in FIG. 1. Unless stated otherwise, the term "front" shall refer to the surface of the element closer to an intended viewer of the display mirror, and the term "rear" shall refer to the surface of the element further from the intended viewer of the display mirror. However, it is to be understood that the disclosure may assume various alternative orientations, except where expressly specified to the contrary. It is also to be understood that the specific devices and processes illustrated in the attached drawings, and described in the following specification are simply exemplary embodiments of the inventive concepts defined in the appended claims. Hence, specific dimensions and other physical characteristics relating to the embodiments disclosed herein are not to be considered as limiting, unless the claims expressly state otherwise.

The terms "including," "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises a . . . " does not, without more constraints, preclude the existence of additional identical elements in the process, method, article, or apparatus that comprises the element.

Referring now to FIGS. 1-3, reference numeral 10 generally designates a display mirror assembly for a vehicle. The display mirror assembly 10 includes a partially reflective, partially transmissive element 12 (also referred to as a "glass element" herein) and a display module 18 (FIG. 4) that is viewed through the partially reflective, partially transmissive element 12. As shown in FIG. 4, the display mirror assembly 10 further includes a bezel 13 integrally coupled with a front shield 14. As shown in FIGS. 4-5, the display module 18 generally includes several components, including a display 22, an optic block 24, a heat sink 26, a light emitting diode (LED) printed circuit board, and a primary printed circuit board 28. A housing 30 at least partially receives the bezel 13, the display module 18, and the rear shield 16, and includes a mounting member 32 extending rearwardly therefrom. The mounting member 32 is adapted for mounting on a windshield or a headliner of a vehicle.

Referring generally to FIGS. 1-4, the display mirror assembly 10 has a viewing area 40, which includes a front surface 42 of the glass element 12. The viewing area 40 may be a rectangular shape, a trapezoidal shape, or any custom contoured shape desired for aesthetic reasons. A second surface of the glass element 12 may include a peripheral hiding layer, such as a chrome ring edge treatment.

Referring to FIG. 4, the display mirror assembly 10 for a vehicle is shown, with the components partially exploded. The display mirror assembly 10 includes the glass element 12 which is attached to the bezel 13. The bezel 13 is integrally coupled with the front shield 14. The front shield 14 and the bezel 13 support the display module 18, the rear housing 30, and the mounting member 32. As shown in FIGS. 4 and 5, the components of the display module 18 include various retaining features to operably connect the several components of the display module 18 with the front shield 14, the bezel 13 and each other, and to provide support to the display module 18. Specifically, the bezel 13 includes retaining features to operably connect the bezel 13 to the display module 18, and the rear shield 16 has retaining features 44 to operably connect the rear shield 16 to the display module 18. The retaining features 44 generally include snap fit connections, tab and slot connections, heat stake connections, screw connections, and other known retaining features. Some or all of the retaining features may also be strengthened by the addition of adhesive compounds. Certain non-limiting illustrative examples of retaining features are described in detail herein.

The display mirror assembly 10 will hereafter be described in greater detail, beginning with the elements closest to the intended viewer, and extending rearwardly away from the viewer.

The glass element 12 may be an electro-optic element or single transflective or an element such as a prism. For electro-optic element constructions, the glass element 12 may include a front substrate and a rear substrate. One non-limiting example of an electro-optic element includes an electrochromic medium, which includes at least one solvent, at least one anodic material, and at least one cathodic material disposed between the first substrate and the rear substrate. Typically, both of the anodic and cathodic materials are electroactive and at least one of them is electrochromic. It will be understood that regardless of its ordinary meaning, the term "electroactive" will be defined herein as a material that undergoes a modification in its oxidation state upon exposure to a particular electrical potential difference. Additionally, it will be understood that the term "electrochromic" will be defined herein, regardless of its ordinary meaning, as a material that exhibits a change in its extinction coefficient at one or more wavelengths upon exposure to a particular electrical potential difference. Electrochromic components, as described herein, include materials whose color or opacity are affected by electric current, such that when an electrical current is applied to the material, the color or opacity change from a first phase to a second phase. The electrochromic component may be a single-layer, single-phase component, multi-layer component, or multi-phase component, as described in U.S. Pat. No. 5,928,572 entitled "Electrochromic Layer And Devices Comprising Same," U.S. Pat. No. 5,998,617 entitled "Electrochromic Compounds," U.S. Pat. No. 6,020,987 entitled "Electrochromic Medium Capable Of Producing A Preselected Color," U.S. Pat. No. 6,037,471 entitled "Electrochromic Compounds," U.S. Pat. No. 6,141,137 entitled "Electrochromic Media For Producing A Pre-selected Color," U.S. Pat. No. 6,241,916 entitled "Electrochromic System," U.S. Pat. No. 6,193,912 entitled "Near Infrared-Absorbing Electrochromic Compounds And Devices Comprising Same," U.S. Pat. No. 6,249,369 entitled "Coupled Electrochromic Compounds With Photostable Dication Oxidation States," and U.S. Pat. No. 6,137,620 entitled "Electrochromic Media With Concentration Enhanced Stability, Process For The Preparation Thereof and Use In Electrochromic Devices"; U.S. Pat. No. 6,519,072, entitled "Electrochromic Device"; and International Patent Application Serial Nos. PCT/US98/05570 entitled "Electrochromic Polymeric Solid Films, Manufacturing Electrochromic Devices Using Such Solid Films, And Processes For Making Such Solid Films And Devices," PCT/EP98/03862 entitled "Electrochromic Polymer System," and PCT/US98/05570 entitled "Electrochromic Polymeric Solid Films, Manufacturing Electrochromic Devices Using Such Solid Films, And Processes For Making Such Solid Films And Devices," all of which are herein incorporated by reference in their entirety. The glass element 12 may also be any other element having partially reflective, partially transmissive properties. To provide electric current to the glass element 12, electrical elements are provided on opposing sides of the element, to generate an electrical potential therebetween. A J-clip may be electrically engaged with each electrical element, and element wires may extend from the J-clips to the primary printed circuit board 28.

Now referring to FIGS. 1-5, the front shield 14 of the bezel 13 functions to shield the display module 18 from emitting radio frequency (RF) electromagnetic radiation and provide electromagnetic-immunity and to provide support for the glass element 12 and the display module 18. The bezel 13 is disposed about a periphery of the glass element 12 and configured to retain the glass element 12 against the display module 18, wherein the front shield 14 is integrally coupled with the bezel 13. The front shield 14 is formed from one or more materials which are suitable to block RF radiation, including without limitation steel. As a non-limiting example, the front shield 14 can be formed from a stamped steel material which is about 0.5 mm thick. A central peripheral wall 46 is positioned adjacent the bezel 13 and the front shield 14. The central peripheral wall 46 is configured to abut a rear surface of the glass element 12. The bezel 13 includes a rounded peripheral edge 48 that closely receives the glass element 12. A back side of the central peripheral wall 46 is in close proximity to, or in abutment with, the display 22.

With reference again to FIGS. 4 and 5, the front shield 14 of the bezel 13 may take on a variety of constructions designed to minimize or eliminate RF electromagnetic radiation from penetrating through the glass element 12 of the display mirror assembly 10. At the same time, the front shield 14 of the bezel 13 together define a composite that prevents or minimizes RF electromagnetic radiation generated by the display 22 or other components inside the housing 30 from leaving the housing 30. As previously noted, the front shield 14 may be formed from a variety of materials. The same is true of the bezel 13. It is generally contemplated that the bezel 13 and the front shield 14 may be formed from different materials to form a composite structure. For example, the bezel 13 may be constructed from a polymeric material that is injection molded over the front shield 14, which may be constructed from a metallic material. Additionally, it is generally contemplated that the central peripheral wall 46, which extends inwardly from the bezel 13, may be formed as part of the bezel 13 or the front shield 14. The central peripheral wall 46 provides structural rigidity to the bezel 13, and may also assist in minimizing RF electromagnetic radiation from penetrating or escaping the display mirror assembly 10. The central peripheral wall 46 also constitutes a locating feature to ensure that the glass element 12 is positioned at the right depth relative to the bezel 13. Accordingly, the glass element 12 can be positioned to slightly protrude forward of the bezel 13, flush with a forward peripheral edge of the bezel 13, or be slightly recessed a front edge of the bezel 13.

As illustrated in FIGS. 6-9, the peripheral edge 48 of the bezel 13 closely receives the glass element 12, and also includes a shape that is complementary to the glass element 12. The bezel 13 also includes a chin 41 on a lower portion thereof. The chin 41 may support a light sensor, one or more buttons that activate functionality inside the display mirror assembly 10, a microphone, etc. The chin may extend over a lower forward portion of the housing 30, or may be received into a lower portion of the housing 30. A periphery of the bezel 13 also includes locating features 51, as well as attachment features 54, which may include snap-fit connectors, mechanical fasteners, etc. The attachment features 54 are generally configured for engagement with complementary attachment features 56 disposed on an inside wall of the housing 30.

With reference now to FIGS. 9-12, the bezel 13 and front shield 14 combination includes a variety of features. Specifically, the front shield includes a set of retaining tabs for engagement with the display module and the bezel 13 includes locating features in the form of recesses 43 defined in a peripheral wall 45 of the bezel 13. The peripheral wall 45 extends about each of four internal sides of the bezel 13. In the illustrated embodiment, the recesses 43 are in the form of partially arcuate recesses configured to receive complementary protuberances 43A extending from lateral walls 45A of the front shield 14. In the illustrated embodiment, the protuberances 43A are arcuate protuberances that generally define a portion of a cylinder. The protuberances 43A are configured to include a radius that is the same as, or slightly less than, the radius of the recesses 43. Accordingly, during engagement of the front shield 14 with the bezel 13, overmolded plastic locks the front shield 14 to the bezel 13. Notably, the peripheral wall 45 of the bezel 13 is generally continuous. The lateral wall 45A of the front shield 14, as illustrated, includes separate wall portions on each of the four sides of the front shield 14. However, it will be understood that the lateral wall 45A of the front shield 14 may be separated, as illustrated, or may be continuous, similar to the design illustrated for the bezel 13. The chin 41 includes an aperture 47 configured to receive one of a button, a sensor, a microphone, etc. In addition, the lateral wall 45A of the bezel 13 includes engagement features 49 configured to receive engagement features 49A of the front shield 14. It is generally contemplated that these features may be used to secure light sensors, or other components utilized by the display mirror assembly 10.

Additionally, the peripheral wall 46 includes a plurality of attachment features configured to engage with one or more of the display 22, the optic block 24, the heat sink 26, the primary printed circuit board 28, the rear shield 16, and the housing 30. The attachment features may include friction-fit designs, snap-fit configurations, etc. It is also generally contemplated that mechanical fasteners or an adhesive may be used to secure the components references above.

With reference again to FIGS. 4 and 5, the display module 18 is disposed behind the front shield 14, with the display 22 viewable through the opening in the front shield 14. The components of the display module 18 are ordered, from the front shield 14 toward the rear shield 16, the display 22, the optic block 24, the heat sink 26, and the primary printed circuit board 28.

The display 22 may be liquid crystal display (LCD), LED, organic light emitting diode (OLED), plasma, digital light processing (DLP), or other display technology. The display 22 further includes a flexible electrical connector 50, which is operably mechanically and electrically connected with the primary printed circuit board 28. The flexible electrical connector 50 has a length L which is sufficient to wrap around the display module 18 components between the display 22 and the primary printed circuit board 28, and has a width which extends substantially along a top edge 52 of the display 22. The flexible electrical connector, when operably coupled to the primary printed circuit board 28, aids in securing the components along a top edge of the display module 18.

With reference again to FIG. 4, a glare sensor 60 is provided on the front side of the printed circuit board 28, in a location which receives light through the bezel 13, and which is not behind the display 22. A glare sensor lens 61 is snap-fit into the aperture 47 in the bezel 13. A glare sensor 60 receives light from headlamps of a trailing vehicle, and measures information regarding the likely glare visible on the glass element 12 and communicates this information to the display mirror assembly 10 so that the display mirror assembly 10 can be optimized to allow viewing of the display 22 through the glass element 12. The vertical/horizontal pattern of the glare sensor 60 is symmetrical, so that orientation of the glare sensor 60 is not significant. The glare sensor 60 could also be packaged at least partially within the housing 30 of the display mirror assembly 10 and have a light guide which is configured to propagate light to the glare sensor 60. The glare sensor 60 could also be an imager on a rear portion of the vehicle, wherein a signal representative of the received light is communicated from the glare sensor 60 to the display mirror assembly 10. An ambient light sensor 63 may also be operably coupled with the printed circuit board 28 and includes a secondary lens 65.

The heat sink 26 is disposed rearwardly from the optic block 24, and dissipates heat generated by the LED printed circuit board 28 and other components of the primary printed circuit board 28. The heat sink 26 has a generally planar body 70 with a front side 72 and a top edge 74.

The primary printed circuit board 28 operates to provide electrical power and control for the components of the display module 18 and for the glass element 12. As shown in FIGS. 4 and 5, the primary printed circuit board 28 is generally planar, with a front side 80, a rear side 82, and side edges 84. The front side 80 is facing the heat sink 26 and the rear side 82 is facing the rear shield 16. Electrical components are generally oriented on both sides of the primary printed circuit board 28. The primary printed circuit board 28 includes an electrical connector for operable electrical engagement with the electrical element wires of the glass element 12, an electrical connector for operable electrical engagement with the flexible electrical connector 50, and an electrical connector 92 for operable electrical engagement with a wiring harness 94. Additional functional elements that may be provided on the display mirror assembly 10 may also be electrically connected to the primary printed circuit board 28, such as the glare sensor 60 and any other functional buttons or features of the display mirror assembly 10. The primary printed circuit board 28 further includes side cutouts 96 along the side edges 84, to permit passage of the mechanical fasteners used to secure the rear shield 16 to the components of the display module 18.

The rear shield 16 functions to shield the printed circuit board 28 from emitting RF radiation. The rear shield 16 also serves to encapsulate the display module 18, and further interlock the components of the display mirror assembly 10. The rear shield 16 is formed from a material which is suitable to block such radiation and provide the desired support for the display mirror assembly 10, such as steel. As a non-limiting example, the rear shield 16 can be formed from stamped steel.

The rear housing 30 includes a forwardly directed cavity 100, into which all or a portion of the front shield 14, rear shield 16, and the display module 18 are received and supported therein. The rear housing 30 includes mechanically engaging features 102 which snap fit with corresponding engagement features 51 of the bezel 13, which are located above locating features 104 on a peripheral wall 106 of the rear shield 16. Alternatively, the mechanically engaging features 102 may engage any of the display module components, such as the heat sink 26. The mounting member 32 is operably engaged with the rear housing 30 in any known manner.

With reference again to FIGS. 4 and 5, a mounting assembly is configured to extend through a rear wall of the housing 30 and into secure engagement with an internal support 107. A plurality of fasteners 108 secure the internal support 107 with the mount 105. Accordingly, the entire display mirror assembly 10 can be supported on the windshield of a vehicle. Notably, an externally-extending wire harness 109 is routed through barrel 111 of the mount 105, or may be routed around or outside of the barrel 111. A camera harness is mounted outside of the mount 105, but could be routed through the barrel 111.

With respect to the following description, the display mirror assembly 10 is considered "on axis" when a line perpendicular to the plane of the glass element 12 extends toward the eyes of a viewer. Due to the display 22 being viewed through the glass element 12, any glare on the glass element 12 may interfere with the visibility of the display 22. When the display mirror assembly 10 is on axis and is being used during night time driving conditions, headlights from a trailing vehicle (i.e., a vehicle driving behind the vehicle with the display mirror assembly 10) can cause a glare which is visible to the driver.

Figure 13A:
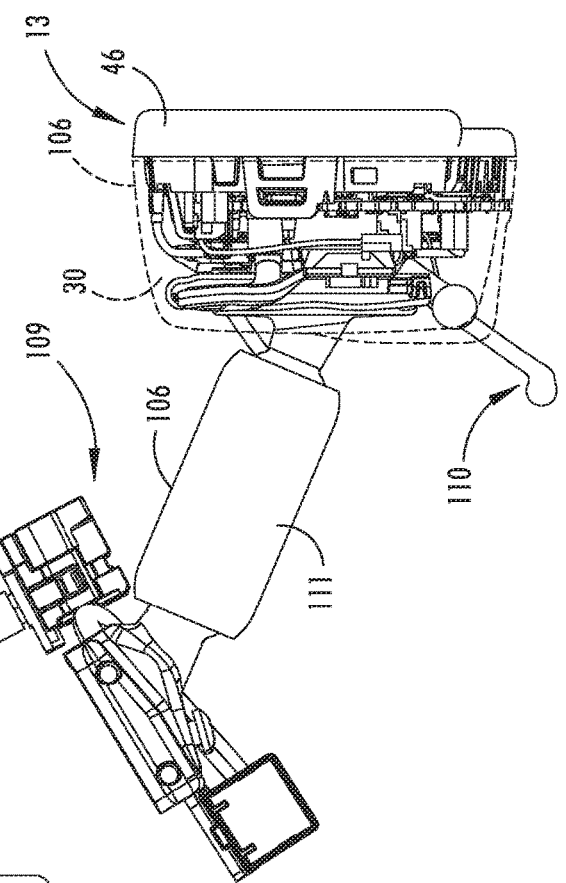
FIG. 13A is a side elevational view of the display mirror assembly of FIG. 1 with the actuator in a first position and the cover in phantom.
Figure 13:
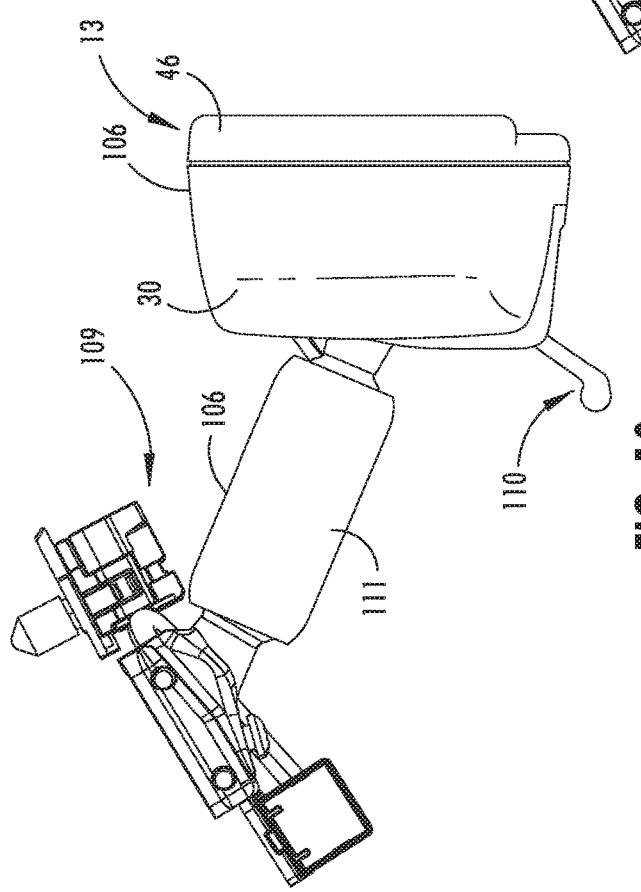
FIG. 13 is a side elevational view of the display mirror assembly of FIG. 1 with the actuator in the first position.

According to one embodiment of the present disclosure, an actuator device 110, as shown in FIGS. 13 and 13A, is operably coupled to the display mirror assembly 10. When actuated, as shown in FIGS. 14 and 14A, the actuator device 110 moves at least the glass element 12 off axis (i.e., away from a direct line toward the driver's eyes). Typically, actuation of the actuator device 110 tilts the glass element 12 upwards, to move the glass element 12 to an off-axis position. However, it should be appreciated that the actuator device 110 can be configured to move the glass element 12 in any direction with respect to the axis. The actuator device 110 can also be configured to move the display 22 upon activation. The actuator device 110 can also be configured to turn the display 22 on or off. Thus, when the actuator device 110 is actuated to move the glass element 12 off axis, the display 22 can be turned on.

As illustrated in FIGS. 4A and 13-14A, the actuator device 110 includes an actuator 112 and an abutment member 114 configured to adjust the angular position of the glass element 12 relative to the eyes of a viewer. As the actuator 112 is adjusted, the abutment 114 moves the glass element 12 and possibly the display 22 as well, such that glare on the glass element 12 can be minimized, redirected, or eliminated.

Additionally, to provide information to the viewer of the display mirror assembly 10, the display mirror assembly 10 may include information regarding the field of view, such as a partially transmissive graphic overlay or an image on the display 22 visible on the viewing area 40 when the display mirror assembly 10 is in use.

The forwardly directed cavity of the rear housing 30 is placed over the bezel 13, and the mechanically engaging features of the rear housing 30 are snap fit to engage with the corresponding engagement feature of the bezel 13. The mounting member 32 may be installed in the rear housing 30 prior to assembly.

The present disclosure may be used with a glass element such as that described in U.S. Pat. Nos. 9,174,577; 8,925,891; 8,814,373; 8,201,800; and 8,210,695; U.S. Patent Application Publication No. 2012/0327234, now U.S. Pat. No. 9,838,653; and U.S. Provisional Patent Application Nos. 61/709,716; 61/707,676; and 61/704,869, which are hereby incorporated herein by reference in their entirety. Further, the present disclosure may be used with a rearview packaging assembly such as that described in U.S. Pat. Nos. 8,885,240; 8,814,373; 8,646,924; 8,643,931; and 8,264,761; and U.S. Provisional Patent Application Nos. 61/707,625; and 61/590,259, which are hereby incorporated herein by reference in their entirety. Additionally, it is contemplated that the present disclosure can include a bezel such as that described in U.S. Pat. Nos. 8,827,517; 8,210,695; and 8,201,800, which are hereby incorporated herein by reference in their entirety.

A display mirror assembly according to the present disclosure has several advantages. The display module is supported between the bezel and housing, and does not require an additional support or carrier plate. Omission of a carrier plate, and inclusion of retaining features in the front shield and rear shield, permits the display mirror assembly to be lighter, involve less parts for manufacturing, and to have a display which is viewable over a larger percentage of the total viewing area of the display mirror assembly. For mirror applications with one or more mirror-based accessories, the accessory or accessories may be received in or disposed at or in the mirror casing and/or may be disposed at the mounting structure of the mirror assembly.

The present disclosure may also include a frameless mirror assembly that has a reflective element adhered or attached to a front or mounting surface of a mirror casing or bezel having a configuration that generally defines a peripheral support. The peripheral support may be externally exposed or hidden within the housing behind the glass element 12. In this instance, the peripheral support does not encompass a perimeter edge region of the front surface of the reflective element. In configurations where the glass element 12 is an electro-optic element, then a peripheral edge of the front substrate can be exposed and not covered by the peripheral support. The rear substrate may or may not be concealed by the peripheral support. The peripheral support may extend behind the glass element 12 between the forward peripheral edge of the housing and a rear side of the front substrate. Alternatively, the peripheral support could be positioned behind the rear substrate within the housing. The flush front surface of the reflective element and peripheral support provides a frameless, and more modern appearance to the mirror assembly. Also, the opaque perimeter border band and peripheral support may contrast or match to further enhance the appearance, depending on the application and desired appearance of the mirror assembly. For example, the opaque border band may include a metallic appearance or may be light absorbing and thus may have a dark color, while the peripheral support may be a dark or black colored plastic or may be chrome plated or otherwise colored to provide the desired or selected appearance of the mirror assembly. It is also contemplated that a distance from a peripheral edge of the display to the housing may be less than 11 mm. Alternatively, a distance from a peripheral edge of the display to a forward peripheral edge of the housing may be less than 6.5 mm, or a distance from a peripheral edge of the display to the housing may be less than 3.0 mm.

It will be appreciated that embodiments of the disclosure described herein may be comprised of one or more conventional processors and unique stored program instructions that control one or more processors to implement, in conjunction with certain non-processor circuits, some, most, or all of the functions of a display mirror assembly 10, as described herein. The non-processor circuits may include, but are not limited to signal drivers, clock circuits, power source circuits, and/or user input devices. As such, these functions may be interpreted as steps of a method used in using or constructing a classification system. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used. Thus, the methods and means for these functions have been described herein. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

It will be understood by one having ordinary skill in the art that construction of the described disclosure and other components is not limited to any specific material. Other exemplary embodiments of the disclosure disclosed herein may be formed from a wide variety of materials, unless described otherwise herein.

For purposes of this disclosure, the term "coupled" (in all of its forms, couple, coupling, coupled, etc.) generally means the joining of two components (electrical or mechanical) directly or indirectly to one another. Such joining may be stationary in nature or movable in nature. Such joining may be achieved with the two components (electrical or mechanical) and any additional intermediate members being integrally formed as a single unitary body with one another or with the two components. Such joining may be permanent in nature or may be removable or releasable in nature unless otherwise stated.

It is also important to note that the construction and arrangement of the elements of the disclosure as shown in the exemplary embodiments is illustrative only. Although only a few embodiments of the present innovations have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited. For example, elements shown as integrally formed may be constructed of multiple parts or elements shown as multiple parts may be integrally formed, the operation of the interfaces may be reversed or otherwise varied, the length or width of the structures and/or members or connector or other elements of the system may be varied, the nature or number of adjustment positions provided between the elements may be varied. It should be noted that the elements and/or assemblies of the system may be constructed from any of a wide variety of materials that provide sufficient strength or durability, in any of a wide variety of colors, textures, and combinations. Accordingly, all such modifications are intended to be included within the scope of the present innovations. Other substitutions, modifications, changes, and omissions may be made in the design, operating conditions, and arrangement of the desired and other exemplary embodiments without departing from the spirit of the present innovations.

It will be understood that any described processes or steps within described processes may be combined with other disclosed processes or steps to form structures within the scope of the present disclosure. The exemplary structures and processes disclosed herein are for illustrative purposes and are not to be construed as limiting.

It is also to be understood that variations and modifications can be made on the aforementioned structures and methods without departing from the concepts of the present disclosure, and further it is to be understood that such concepts are intended to be covered by the following claims unless these claims by their language expressly state otherwise.

What is claimed is:

1. A display mirror assembly for a vehicle, comprising:
a housing;
a glass element operably coupled with the housing;
a display module mounted between the glass element and the housing and including a display, an optic block, and a printed circuit board, the display module being configured to be turned to an on state and an off state;
a peripheral support disposed proximate a periphery of the glass element and configured to retain the glass element against the display module;
a radio frequency shield integrally formed with the peripheral support, wherein the peripheral support is constructed from a polymeric material and the radio frequency shield is constructed from a metallic material, and wherein the polymeric material is overmolded onto the metallic material; and
an actuator device disposed on a bottom surface of the housing and operably coupled with the glass element, wherein the actuator device is adjustable to tilt the glass element in one direction, thereby moving the glass element to an off-axis position which approximately simultaneously changes the on/off state of the display module, wherein the actuator device is also adjustable to tilt the glass element in another direction, thereby moving the glass element to an on-axis position which approximately simultaneously changes the on/off state of the display module.

2. The display mirror assembly of claim 1, wherein the peripheral support includes an internally-extending peripheral wall that abuts an outer portion of the glass element.

3. The display mirror assembly of claim 1, wherein the glass element includes a front substrate and a rear substrate, and wherein a peripheral edge of the front substrate is exposed such that the peripheral support is positioned behind the front substrate.

4. The display mirror assembly of claim 1, further comprising:
a chin extending downward from and integral with the peripheral support.

5. The display mirror assembly of claim 4, wherein the printed circuit board is operably coupled with an external button disposed on the chin.

6. The display mirror assembly of claim 4, further comprising:
a light sensor positioned in the chin of the peripheral support.

7. The display mirror assembly of claim 1, wherein the glass element includes a peripheral hiding layer.

8. The display mirror assembly of claim 1, wherein the display module includes a display that has a shape which corresponds to the shape of the glass element, and wherein the display is an LCD, LED, OLED, plasma, or DLP display element.

9. The display mirror assembly of claim 1, further comprising:
a partially transmissive graphic overlay which provides information to a viewer regarding the field of view shown in the display mirror assembly.

10. The display mirror assembly of claim 1, wherein the display module is capable of displaying an image which provides information to a viewer regarding the field of view shown in the display mirror assembly.

11. The display mirror assembly of claim 1, wherein a distance from a peripheral edge of the display to the housing is less than 11 mm.

12. The display mirror assembly of claim 1, wherein a distance from a peripheral edge of the display to the housing is less than 6.5 mm.

13. The display mirror assembly of claim 1, wherein, a distance from a peripheral edge of the display to the housing is less than 3.0 mm.

14. The display mirror assembly of claim 1, wherein the glass element includes an electro-optic element.

15. A display mirror assembly for a vehicle, comprising:
a partially reflective, partially transmissive element;
a display module operably coupled with the partially reflective, partially transmissive element and configured to be turned to an on state and an off state;
a polymeric bezel disposed about a periphery of the partially reflective, partially transmissive element and configured to retain the glass element against the display module;
a radio frequency shield formed from a metallic material and integrated into the polymeric bezel, the radio frequency shield including an internal peripheral wall that abuts a rear of the partially reflective, partially transmissive element; and
an actuator device operably coupled with the partially reflective, partially transmissive element, wherein the actuator device is adjustable to tilt the partially reflective, partially transmissive element to an off-axis position which approximately simultaneously changes the on/off state of the display module, wherein the actuator device is also adjustable to tilt the partially reflective, partially transmissive element to an on-axis position which approximately simultaneously changes the on/off state of the display module.

16. The display mirror assembly of claim 15, wherein the polymeric bezel includes rearwardly-extending engagement features engaged with a forward portion of the housing.

17. The display mirror assembly of claim 15, further comprising:
a chin extending downward from and integral with the polymeric bezel.

18. The display mirror assembly of claim 15, wherein the glass element includes a front substrate and a rear substrate, and wherein a peripheral edge of the front substrate is exposed such that the bezel is positioned behind the front substrate.

19. A display mirror assembly for a vehicle, comprising:
a housing;
an electro-optic element including a front surface and a rearward surface operably coupled with the housing;
a display module mounted at least partially between the electro-optic element and the housing and operably coupled to a printed circuit board, the display module configured to be turned to an on state and an off state; and
a polymeric bezel disposed about a periphery of the front surface of the electro-optic element and configured to retain the electro-optic element against the display module, wherein a metallic radio frequency shield is integrally formed with the polymeric bezel, and also disposed between the electro-optic element and the display module.

* * * * *